US012727273B2

United States Patent
(12) United States Patent
Yun

(10) Patent No.: US 12,727,273 B2
(45) Date of Patent: Sep. 1, 2026

(54) IMAGE SENSOR CHIP AND SEMICONDUCTOR PACKAGE INCLUDING THE SAME

(71) Applicant: Samsung Electronics Co., Ltd., Suwon-si (KR)

(72) Inventor: Youngmin Yun, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 453 days.

(21) Appl. No.: 18/296,691

(22) Filed: Apr. 6, 2023

(65) Prior Publication Data

US 2024/0030254 A1 Jan. 25, 2024

(30) Foreign Application Priority Data

Jul. 22, 2022 (KR) ........................ 10-2022-0091280

(51) Int. Cl.
*H10F 39/00* (2025.01)
*H10F 39/18* (2025.01)

(52) U.S. Cl.
CPC ....... *H10F 39/8063* (2025.01); *H10F 39/011* (2025.01); *H10F 39/182* (2025.01); *H10F 39/804* (2025.01); *H10F 39/8053* (2025.01); *H10F 39/8057* (2025.01); *H10F 39/811* (2025.01)

(58) Field of Classification Search
CPC .... H10F 39/011; H10F 39/024; H10F 39/182; H10F 39/802; H10F 39/804; H10F 39/8053; H10F 39/8057; H10F 39/8063; H10F 39/811
See application file for complete search history.

(56) References Cited

U.S. PATENT DOCUMENTS 6,566,745 B1 5/2003 Beyne et al.
7,202,899 B2 4/2007 Lin et al.
7,535,509 B2 5/2009 Takayama
(Continued)

FOREIGN PATENT DOCUMENTS

CN 113013184 A * 6/2021 ......... H10F 39/8063
JP WO2005020328 A1 * 10/2006 ............. H04N 23/54
(Continued)

*Primary Examiner* — Matthew E Warren
(74) *Attorney, Agent, or Firm* — Wolf, Greenfield & Sacks, P.C.

(57) ABSTRACT

A semiconductor package includes a package substrate, an image sensor chip on the package substrate, a transparent substrate on the image sensor chip, and a dam structure on an edge of the image sensor chip and between the image sensor chip and the transparent substrate. The image sensor chip includes a semiconductor substrate including a pixel array region and a pad region around the pixel array region, the pixel array region including a light receiving region and a light blocking region between the light receiving region and the pad region, color filters on the light receiving region of the semiconductor substrate, a light blocking pattern on the light blocking region of the semiconductor substrate, micro lenses on the color filters, and a lens structure on the light blocking pattern and surrounding the light receiving region. The dam structure may be on at least a portion of the lens structure.

20 Claims, 21 Drawing Sheets

(56) References Cited

U.S. PATENT DOCUMENTS

| | | | | |
|---|---|---|---|---|
| 7,651,878 | B2 | 1/2010 | Ryu | |
| 9,413,343 | B2 | 8/2016 | Yoo | |
| 10,134,794 | B2 | 11/2018 | Huang et al. | |
| 10,388,684 | B2 | 8/2019 | Kinsman et al. | |
| 2005/0041134 | A1* | 2/2005 | Takayama | G02B 3/0075 257/E31.127 |
| 2018/0097028 | A1* | 4/2018 | Kinsman | H10F 39/8057 |
| 2018/0358396 | A1 | 12/2018 | Huang et al. | |
| 2019/0123088 | A1 | 4/2019 | Kwon | |
| 2021/0375817 | A1* | 12/2021 | Fujimagari | A61B 1/000095 |
| 2023/0253426 | A1* | 8/2023 | Yun | H10F 39/011 257/434 |

FOREIGN PATENT DOCUMENTS

| | | | | | |
|---|---|---|---|---|---|
| JP | 2012-174738 | A | | 9/2012 | |
| JP | 2021-166259 | A | | 10/2021 | |
| JP | 2022-023664 | A | | 2/2022 | |
| KR | 100736423 | B1 | | 7/2007 | |
| KR | 20190045642 | A | | 5/2019 | |
| KR | 20200087909 | A | * | 7/2020 | H10F 39/807 |
| KR | 102158273 | B1 | | 9/2020 | |
| KR | 10-2022-0022504 | A | | 2/2022 | |
| TW | 200308058 | A | | 12/2003 | |
| WO | WO-2020075410 | A1 | * | 4/2020 | H10K 59/8792 |

* cited by examiner

IMAGE SENSOR CHIP AND SEMICONDUCTOR PACKAGE INCLUDING THE SAME

CROSS-REFERENCE TO RELATED APPLICATIONS

This U.S. non-provisional patent application claims priority under 35 U.S.C. § 119 to Korean Patent Application No. 10-2022-0091280, filed on Jul. 22, 2022, in the Korean Intellectual Property Office, the entire contents of which are hereby incorporated by reference.

BACKGROUND

The present disclosure relates to a semiconductor package, and more particularly, to a semiconductor package including an image sensor chip.

Image sensors such as charge coupled device (CCD) image sensors and/or complementary metal-oxide-semiconductor (CMOS) image sensors may be applied to various electronic products such as mobile phones, digital cameras, optical mice, monitoring cameras, and biometric devices. As small and multi-functional electronic products are being developed, it may be required that semiconductor packages including image sensors have excellent characteristics such as a small size, high density, low power, multi-functionality, high-speed data processing, high reliability, low cost, and clear image quality. Various techniques for satisfying these requirements have been studied.

SUMMARY

Embodiments of the inventive concepts may provide an image sensor chip with a small size and improved reliability, and a semiconductor package including the same.

In an aspect, a semiconductor package may include a package substrate, an image sensor chip on the package substrate, a transparent substrate on the image sensor chip, and a dam structure on an edge of the image sensor chip and between the image sensor chip and the transparent substrate. The image sensor chip may include a semiconductor substrate including a pixel array region and a pad region around the pixel array region, the pixel array region including a light receiving region and a light blocking region between the light receiving region and the pad region, color filters on the light receiving region of the semiconductor substrate, a light blocking pattern disposed on the light blocking region of the semiconductor substrate, micro lenses on the color filters, and a lens structure on the light blocking pattern and surrounding the light receiving region. The dam structure may be on at least a portion of the lens structure.

In an aspect, a semiconductor package may include a package substrate including bonding pads, an image sensor chip on the package substrate and including conductive pads connected to the bonding pads through bonding wires, a transparent substrate on the image sensor chip, and a dam structure on an edge of the image sensor chip between the image sensor chip and the transparent substrate and covering the conductive pads. The image sensor chip may further include a semiconductor substrate including a pixel array region and a pad region around the pixel array region, the pixel array region including a light receiving region and a light blocking region between the light receiving region and the pad region, photoelectric conversion elements in the pixel array region of the semiconductor substrate, color filters on the light receiving region of the semiconductor substrate, a light blocking pattern on the light blocking region of the semiconductor substrate, micro lenses on the color filters, at least two lens bar patterns on the light blocking pattern and surrounding the light receiving region, an upper planarization layer between the light blocking pattern and the lens bar patterns and between the micro lenses and the color filters, and a passivation layer covering surfaces of the micro lenses and surfaces of the lens bar patterns. The dam structure may be on at least a portion of the at least two lens bar patterns.

In an aspect, an image sensor chip may include a semiconductor substrate including a pixel array region and a pad region around the pixel array region, the pixel array region including a light receiving region and a light blocking region between the light receiving region and the pad region, photoelectric conversion elements in the pixel array region of the semiconductor substrate of the, color filters on the light receiving region of the semiconductor substrate, a light blocking pattern on the light blocking region of the semiconductor substrate, micro lenses on the color filters, and a lens structure on the light blocking pattern and surrounding the light receiving region of the semiconductor substrate. The lens structure may include at least two lens bar patterns.

DETAILED DESCRIPTION

Example embodiments of the inventive concepts will now be described more fully with reference to the accompanying drawings.

Figure 1:
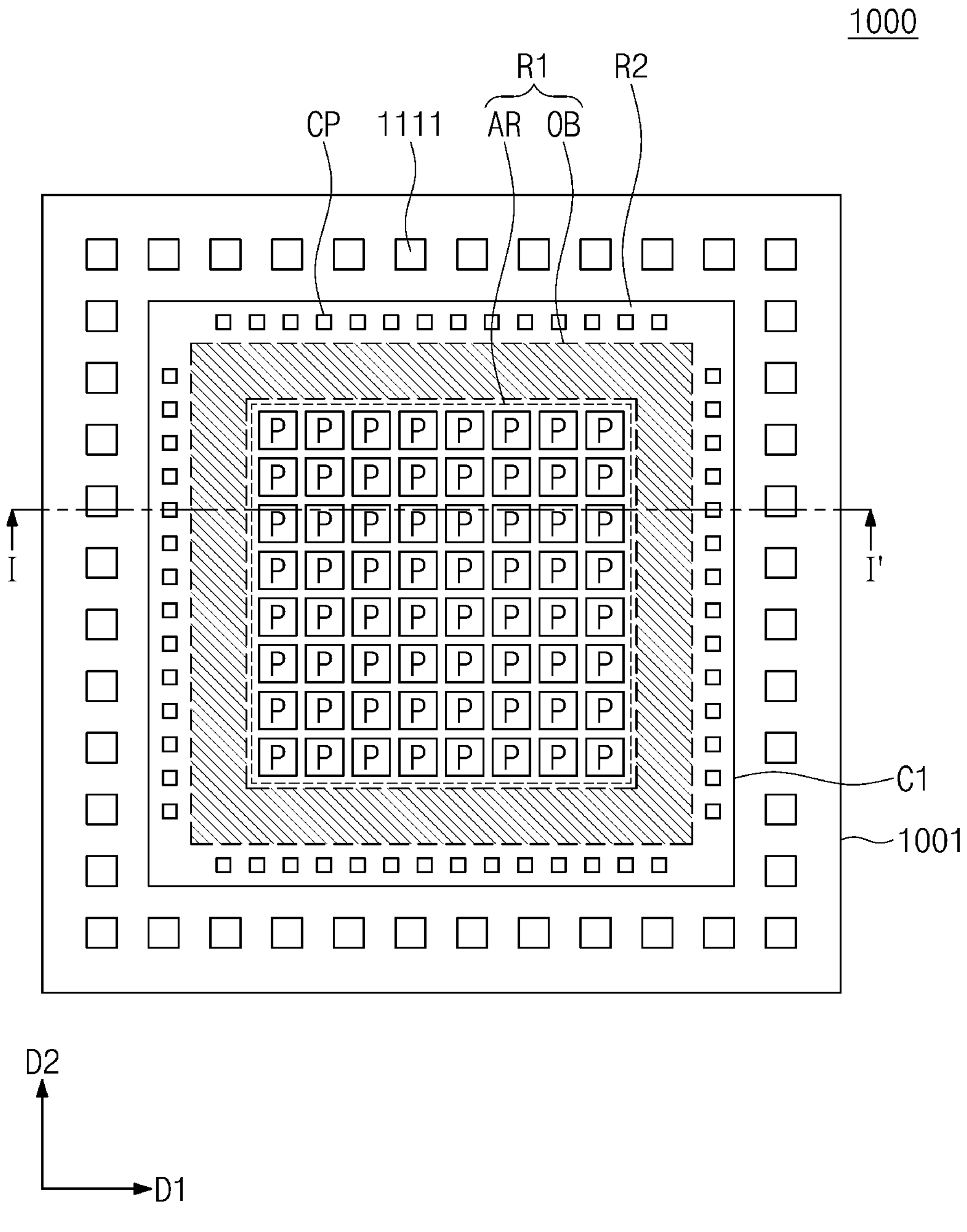
FIG. 1 is a plan view illustrating a semiconductor package according to some embodiments of the inventive concepts.
Figure 2:
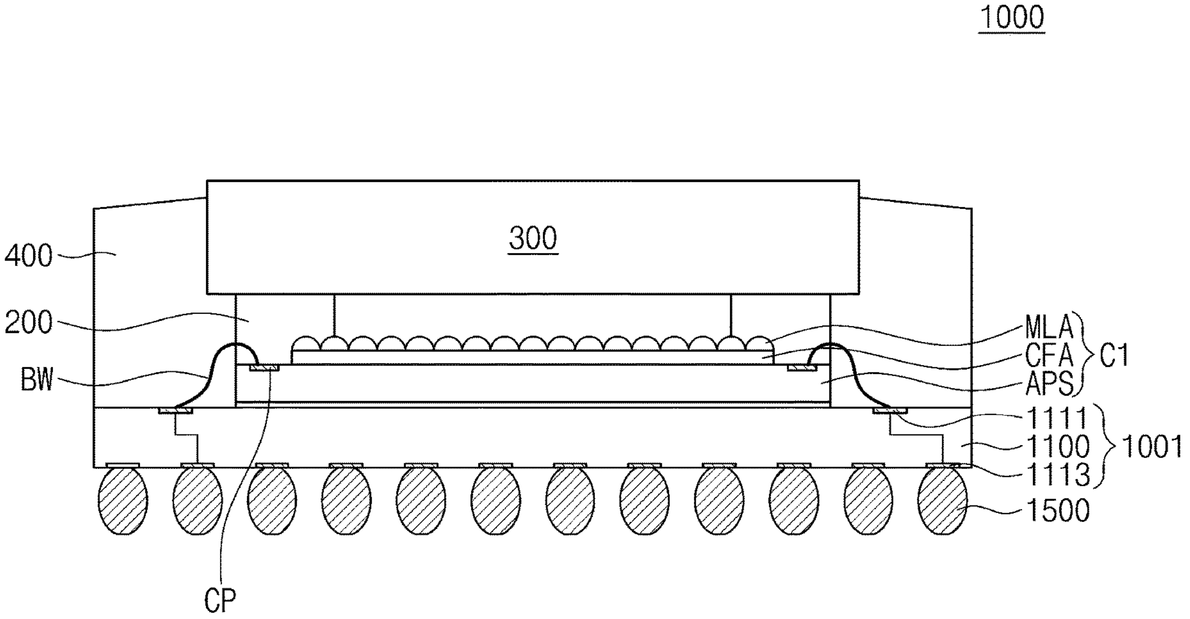
FIG. 2 is a cross-sectional view taken along a line I-I' of FIG. 1 to illustrate a semiconductor package according to some embodiments of the inventive concepts.

FIG. 1 is a plan view illustrating a semiconductor package according to some embodiments of the inventive concepts. FIG. 2 is a cross-sectional view taken along a line I-I' of FIG. 1 to illustrate a semiconductor package according to some embodiments of the inventive concepts.

Referring to FIGS. 1 and 2, a semiconductor package 1000 according to some embodiments of the inventive concepts may include a package substrate 1001, an image sensor chip C1, a dam structure 200, a transparent substrate 300, and a molding layer 400.

The package substrate 1001 may include or use at least one of various kinds of substrates such as a printed circuit board (PCB), a flexible substrate, and a tape substrate. For example, the package substrate 1001 may be a printed circuit board in which internal interconnection lines are formed.

The package substrate 1001 may include a base substrate 1100, bonding pads 1111 disposed at a top surface of the base substrate 1100, and connection pads 1113 disposed at a bottom surface of the base substrate 1100.

The base substrate 1100 may be formed of at least one of various materials. For example, the base substrate 1100 may be formed of silicon, ceramic(s), an organic material, glass, and/or an epoxy resin, depending on a kind of the package substrate 1001. The base substrate 1100 may include single-layered or multi-layered internal interconnection lines.

The bonding pads 1111 may be electrically connected to the connection pads 1113 through the internal interconnection lines. The bonding pads 1111 may be electrically connected to conductive pads CP of the image sensor chip C1 through bonding wires BW formed of a metal material.

The bonding pads 1111 may be disposed on an edge of the base substrate 1100. The bonding pads 1111 may be disposed around the image sensor chip C1 mounted on the package substrate 1001. The bonding pads 1111 are arranged in a line to surround the image sensor chip C1 in FIG. 1, but embodiments of the inventive concepts are not limited thereto. In certain embodiments, the bonding pads 1111 may be arranged in two lines to surround the image sensor chip C1. In certain embodiments, the bonding pads 1111 may be disposed at both sides of the image sensor chip C1.

The connection pads 1113 may be two-dimensionally arranged on the bottom surface of the base substrate 1100. Connection terminals 1500 (e.g., solder balls or solder bumps) may be adhered to the connection pads 1113.

The image sensor chip C1 may be mounted on the package substrate 1001. The image sensor chip C1 may be adhered to a top surface of the package substrate 1001 by an adhesive layer or a bonding tape.

The image sensor chip C1 may include a pixel array region R1 and a pad region R2 around the pixel array region R1.

The pixel array region R1 may include a plurality of unit pixels P two-dimensionally arranged in a first direction D1 and a second direction D2 which intersect each other or are perpendicular to each other. Each of the unit pixels P may include a photoelectric conversion element and readout element(s). An electrical signal generated by incident light may be output from each of the unit pixels P of the pixel array region R1.

The pixel array region R1 may include alight receiving region AR and a light blocking region OB. The light blocking region OB may be provided between the light receiving region AR and the pad region R2. The light blocking region OB may surround the light receiving region AR when viewed in a plan view. In other words, the light blocking region OB may be disposed at top, bottom, left and right sides of the light receiving region AR when viewed in a plan view.

Reference pixels to which light is not incident may be provided in the light blocking region OB, and the amounts of charges sensed from the unit pixels P of the light receiving region AR may be compared with a reference charge amount generated from the reference pixels to calculate magnitudes of electrical signals sensed from the unit pixels P.

A plurality of the conductive pads CP used to input/output control signals and photoelectric signals may be disposed in the pad region R2. The pad region R2 may surround the pixel array region R1 in a plan view to realize electrical connection with an external device. Electrical signals generated from the unit pixels P may be output to the external device through the conductive pads CP. The conductive pads CP may be connected to the package substrate 1001 through the bonding wires BW. Alternatively, the conductive pads CP of the image sensor chip C1 may be connected to the package substrate 1001 by a flip-chip bonding method using solder balls or solder bumps.

The image sensor chip C1 may include an active pixel sensor array APS, a color filter layer CFA, and a micro lens layer MLA.

The active pixel sensor array APS may include the photoelectric conversion elements in the pixel array region R1 and may include the conductive pads CP in the pad region R2. For example, the photoelectric conversion element may include a photodiode, a photo transistor, a photo gate, a pinned photodiode (PPD), or any combination thereof. In addition, the active pixel sensor array APS may include readout circuits (e.g., MOS transistors) electrically connected to the photoelectric conversion elements.

The color filter layer CFA may be disposed on the active pixel sensor array APS. The color filter layer CFA may include color filters corresponding to the unit pixels P, respectively. The color filters may include blue, red and green color filters. In certain examples, the color filters may include magenta, cyan and yellow color filters. In certain examples, some of the color filters may include a white color filter or an infrared filter.

The micro lens layer MLA may be disposed on the color filter layer CFA. The micro lens layer MLA may include a plurality of micro lenses configured to concentrate light incident from the outside. Each of the micro lenses may have an upwardly convex shape and may have a specific radius of curvature. The micro lenses may change a path of light incident to the image sensor chip C1 to concentrate light. The micro lenses may be two-dimensionally arranged in the first and second directions D1 and D2 perpendicular to each other and may be disposed to correspond to the unit pixels P, respectively. In certain embodiments, at least one of the micro lenses may be disposed in common on at least two photoelectric conversion elements.

The image sensor chip C1 according to embodiments of the inventive concepts will be described in more detail with reference to FIGS. 3 to 8.

The dam structure 200 may be disposed between the image sensor chip C1 and the transparent substrate 300. The dam structure 200 may be disposed along the edge of the image sensor chip C1 and may have a closed-curve or continuous shape. The dam structure 200 may fix the transparent substrate 300 and may separate the image sensor chip C1 and the transparent substrate 300 from each other. In other words, an empty space may be provided between the transparent substrate 300 and the image sensor chip C1 by the dam structure 200. The dam structure 200 may seal or close the empty space between the transparent substrate 300 and the image sensor chip C1 to prevent moisture or a foreign material from permeating into the empty space from the outside.

In some embodiments, the dam structure 200 may be provided on the pad region R2 and a portion (i.e., a portion of the light blocking region OB) of the pixel array region R1 of the image sensor chip C1. In other words, the dam structure 200 may cover the conductive pads CP and may cover a portion of the micro lens layer MLA. In other words, the dam structure 200 may overlap with the pad region R2 and a portion of the light blocking region OB of the image sensor chip C1.

The dam structure 200 may include an insulating material. For example, the dam structure 200 may include at least one of an epoxy resin, polyimide, or a resist. The dam structure 200 may include a dry film resist (DFR), or an insulating material.

The transparent substrate 300 may be spaced apart from the image sensor chip C1 by the dam structure 200. The transparent substrate 300 may be formed of a transparent glass, a transparent resin, or transparent ceramic(s). The transparent substrate 300 may have a width greater than that of the image sensor chip C1, and a thickness of the transparent substrate 300 may be greater than a thickness of the image sensor chip C1.

The molding layer 400 may be disposed on the package substrate 1001 and may seal or encapsulate the image sensor chip C1, the bonding wires BW, and the transparent substrate 300.

More particularly, the molding layer 400 may cover at least a portion of the top surface of the package substrate 1001 and at least portions of side surfaces of the image sensor chip C1 and the transparent substrate 300. The molding layer 400 may have a closed-curve or continuous shape when viewed in a plan view.

The molding layer 400 may cover at least portions of the bonding wires BW and may cover or surround an outer side surface of the dam structure 200. The molding layer 400 and the dam structure 200 may prevent the image sensor chip C1 from being contaminated by an external foreign material. In addition, the molding layer 400 may protect the semiconductor package 1000 from an external impact.

The molding layer 400 may have a top surface which is inclined and is at a lower vertical level than a top surface of the transparent substrate 300. Alternatively, the top surface of the molding layer 400 may be coplanar or substantially coplanar with the top surface of the transparent substrate 300.

The molding layer 400 may include an epoxy resin composite. The epoxy resin composite may include epoxy, a hardener, and a filler. For example, the molding layer 400 may be formed of an epoxy molding compound (EMC). However, the material of the molding layer 400 is not limited to the EMC.

Figure 3:
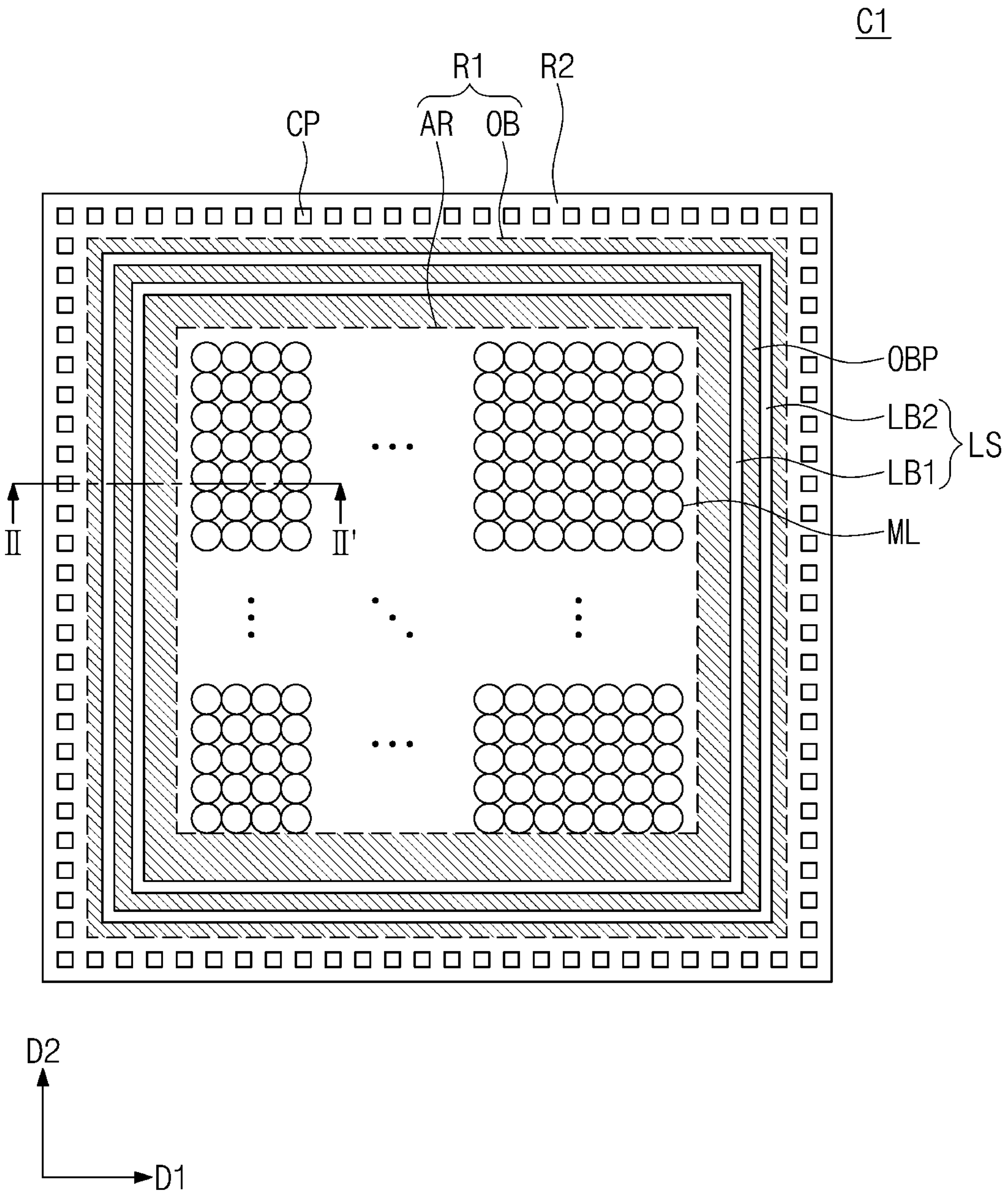
FIG. 3 is a plan view illustrating an image sensor chip according to some embodiments of the inventive concepts.
Figure 4:
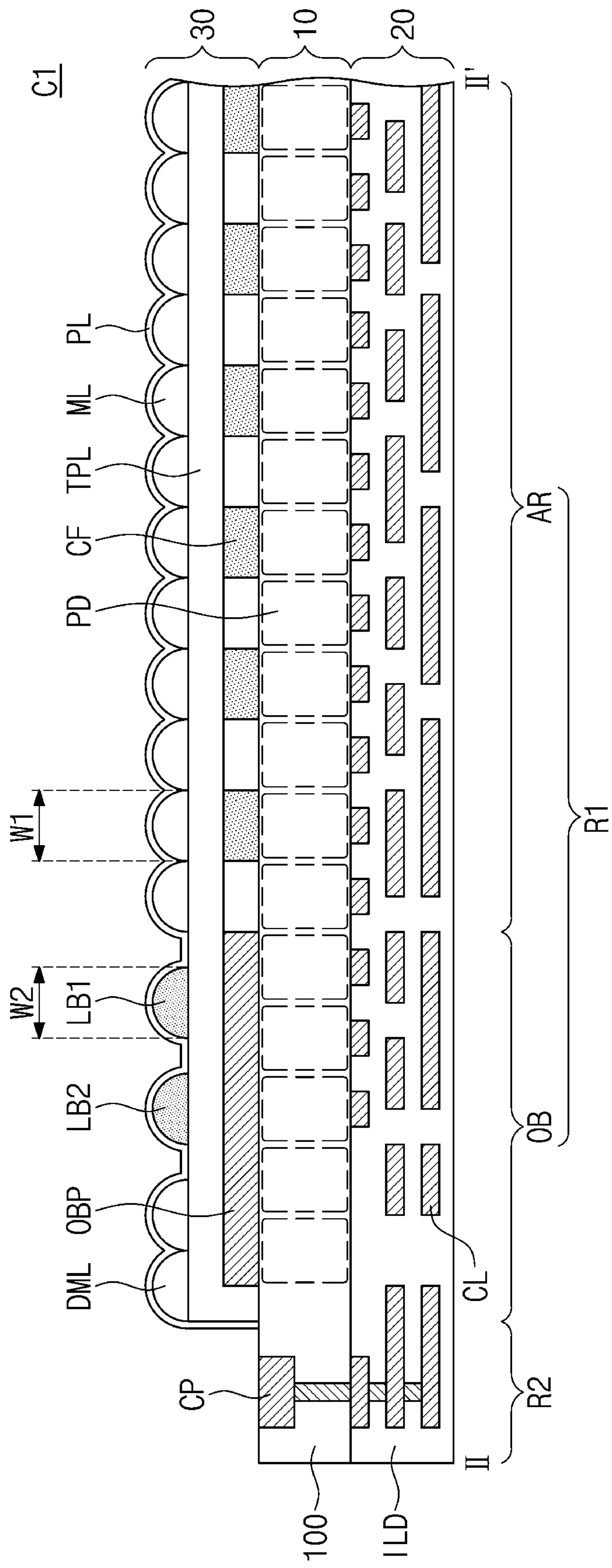
FIG. 4 is a cross-sectional view taken along a line II-II' of FIG. 3 to illustrate an image sensor chip according to some embodiments of the inventive concepts.

FIG. 3 is a plan view illustrating an image sensor chip according to some embodiments of the inventive concepts. FIG. 4 is a cross-sectional view taken along a line II-II' of FIG. 3 to illustrate an image sensor chip according to some embodiments of the inventive concepts.

Referring to FIGS. 3 and 4, as described above, the image sensor chip C1 may include the pixel array region R1 and the pad region R2 around the pixel array region R1. The pixel array region R1 may include the light receiving region AR and the light blocking region OB.

The image sensor chip C1 may include a photoelectric conversion layer 10, a readout circuit layer 20, and a light transmitting layer 30 when viewed in a vertical view.

The photoelectric conversion layer 10 may be disposed between the readout circuit layer 20 and the light transmitting layer 30 when viewed in a vertical view. The photoelectric conversion layer 10 may include photoelectric conversion regions PD having a second conductivity type, which are provided in a semiconductor substrate 100 having a first conductivity type in the pixel array region R1. The photoelectric conversion regions PD may generate photo charges in proportion to an intensity of incident light. In other words, light incident from the outside may be converted into electrical signals in the photoelectric conversion regions PD.

In the pad region R2, the conductive pads CP may be disposed in or on the semiconductor substrate 100. The conductive pads CP may be used to input/output electrical signals generated from the unit pixels to an external device.

The readout circuit layer 20 may be disposed on a first surface of the semiconductor substrate 100. The readout circuit layer 20 may include readout circuits (e.g., MOS transistors) connected to the photoelectric conversion layer 10. Electrical signals converted in the photoelectric conversion layer 10 may be processed in the readout circuit layer 20. For example, the readout circuit layer 20 may include reset transistors, source follower transistors, and selection transistors.

More particularly, the readout circuit layer 20 may include MOS transistors formed on the first surface of the semiconductor substrate 100, connection lines CL connected to the MOS transistors, and interlayer insulating layers ILD disposed between the connection lines CL. The connection lines CL may be multi-layered, and the connection lines CL located at different vertical levels may be connected to each other through contact plugs.

The light transmitting layer 30 may be disposed on a second surface, opposite to the first surface, of the semiconductor substrate 100. The light transmitting layer 30 may include color filters CF, a light blocking pattern OBP, an upper planarization layer TPL, micro lenses ML, a lens structure LS, dummy micro lenses DML, and a passivation layer PL.

The color filters CF may be disposed on the semiconductor substrate 100 in the light receiving region AR and may be disposed to correspond to or align with the photoelectric conversion regions PD, respectively. Depending on a kind of the unit pixel, each of the color filters CF may include a red, green or blue color filter or may include a magenta, cyan or yellow color filter.

The light blocking pattern OBP may be disposed on the semiconductor substrate 100 in the light blocking region OB. The light blocking pattern OBP may block light incident to the semiconductor substrate 100. The light blocking pattern OBP may include a metal and/or a metal nitride. For example, the light blocking pattern OBP may include tungsten, titanium, and/or titanium nitride.

The upper planarization layer TPL may be disposed on the color filters CF and the light blocking pattern OBP. The upper planarization layer TPL may be disposed in the pixel array region R1 and may expose the conductive pads CP of the pad region R2.

The upper planarization layer TPL may include a transparent insulating material. The upper planarization layer TPL may include an organic material such as a polymer. For example, the upper planarization layer TPL may include glass, an epoxy resin, a silicon resin, polyurethane, any other applicable material, or a combination thereof. Alternatively, the upper planarization layer TPL may include a silicon oxide layer or a silicon oxynitride layer.

In the light receiving region AR, the micro lenses ML may be disposed on the upper planarization layer TPL. The micro lenses ML may be two-dimensionally arranged in the first and second directions D1 and D2 perpendicular to each other. Each of the micro lenses ML may have an upwardly convex shape and may have a specific radius of curvature. The micro lenses ML may be disposed to correspond to the color filters CF, respectively. The micro lenses ML may vertically overlap or align with the photoelectric conversion regions PD.

The micro lenses ML may be formed of a transparent insulating material and may include the same material as the upper planarization layer TPL. The micro lenses ML may be formed of a transparent resin. Each of the micro lenses ML may have a convex shape and may have a specific radius of curvature. The micro lenses ML may have substantially the same diameter and the same width. Alternatively, a size of one of the micro lenses ML may be different from a size of other(s) of the micro lenses ML.

In the light blocking region OB, the lens structure LS may be disposed on the upper planarization layer TPL. The lens structure LS may be spaced apart from the micro lenses ML. The lens structure LS may include the same material as the micro lenses ML.

The lens structure LS may have a closed-curve or continuous shape surrounding the light receiving region AR when viewed in a plan view. The lens structure LS may include at least two or more lens bar patterns LB1 and LB2 spaced apart from each other in the light blocking region OB. The at least two or more lens bar patterns LB1 and LB2 may be disposed between the conductive pads CP and the micro lenses ML when viewed in a plan view.

For example, the lens structure LS may include first and second lens bar patterns LB1 and LB2 disposed in the light blocking region OB to surround the light receiving region AR.

Each of the first and second lens bar patterns LB1 and LB2 may have a closed-curve or continuous shape surrounding the light receiving region AR when viewed in a plan view. Each of the first and second lens bar patterns LB1 and LB2 may have a substantially tetragonal ring shape (or polygonal shape such as a square or rectangular shape). The first and second lens bar patterns LB1 and LB2 may be spaced apart from each other. A width W2 of each of the first and second lens bar patterns LB1 and LB2 in one direction may be substantially equal to a width W1 of each of the micro lenses ML in the one direction. For example, the width W2 of each of the first and second lens bar patterns LB1 and LB2 may range from about 100 nm to about 3000 nm.

Each of the first and second lens bar patterns LB1 and LB2 may have a top surface which is upwardly convex. The first and second lens bar patterns LB1 and LB2 may be formed together with the micro lenses ML. In other words, photoresist patterns may be formed by a photolithography process, and then, a reflow process may be performed on the photoresist patterns to form the first and second lens bar patterns LB1 and LB2 having round shapes.

In the light blocking region OB, the dummy micro lenses DML may be disposed on the upper planarization layer TPL. The dummy micro lenses DML may be disposed to be closer to the pad region R2 than to the light receiving region AR. In other words, the dummy micro lenses DML may be disposed between the lens structure LS and the conductive pads CP when viewed in a plan view. In addition, the dummy micro lenses DML may also be disposed between the lens structure LS and the micro lenses ML.

The dummy micro lenses DML may have substantially the same size as the micro lenses ML and may be arranged in substantially the same form as the micro lenses ML.

The passivation layer PL may conformally cover top surfaces of the micro lenses ML, the lens structure LS and the dummy micro lenses DML. The passivation layer PL may be formed of a material different from those of the micro lenses ML and the lens structure LS. For example, the passivation layer PL may be formed of an inorganic oxide.

Figure 5:
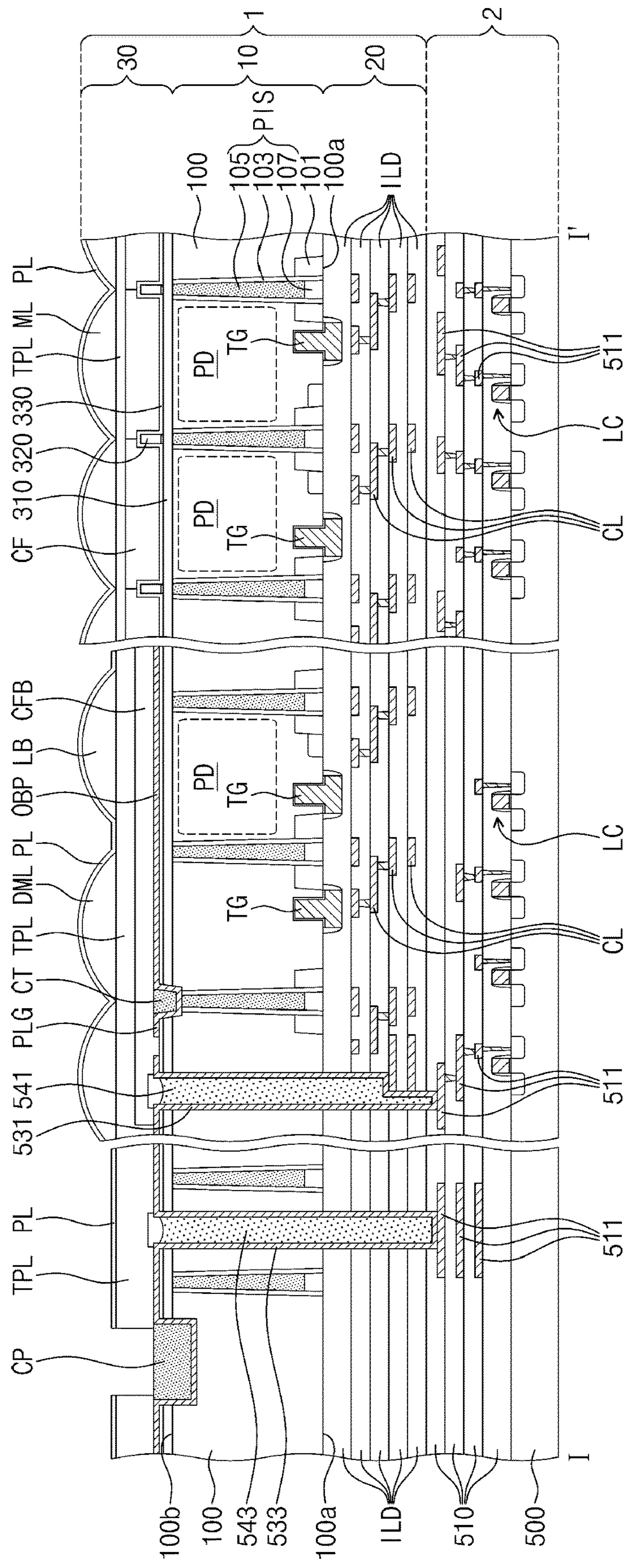
FIGS. 5, 6 and 7 are cross-sectional views illustrating portions of image sensor chips according to some embodiments of the inventive concepts.
Figure 6:
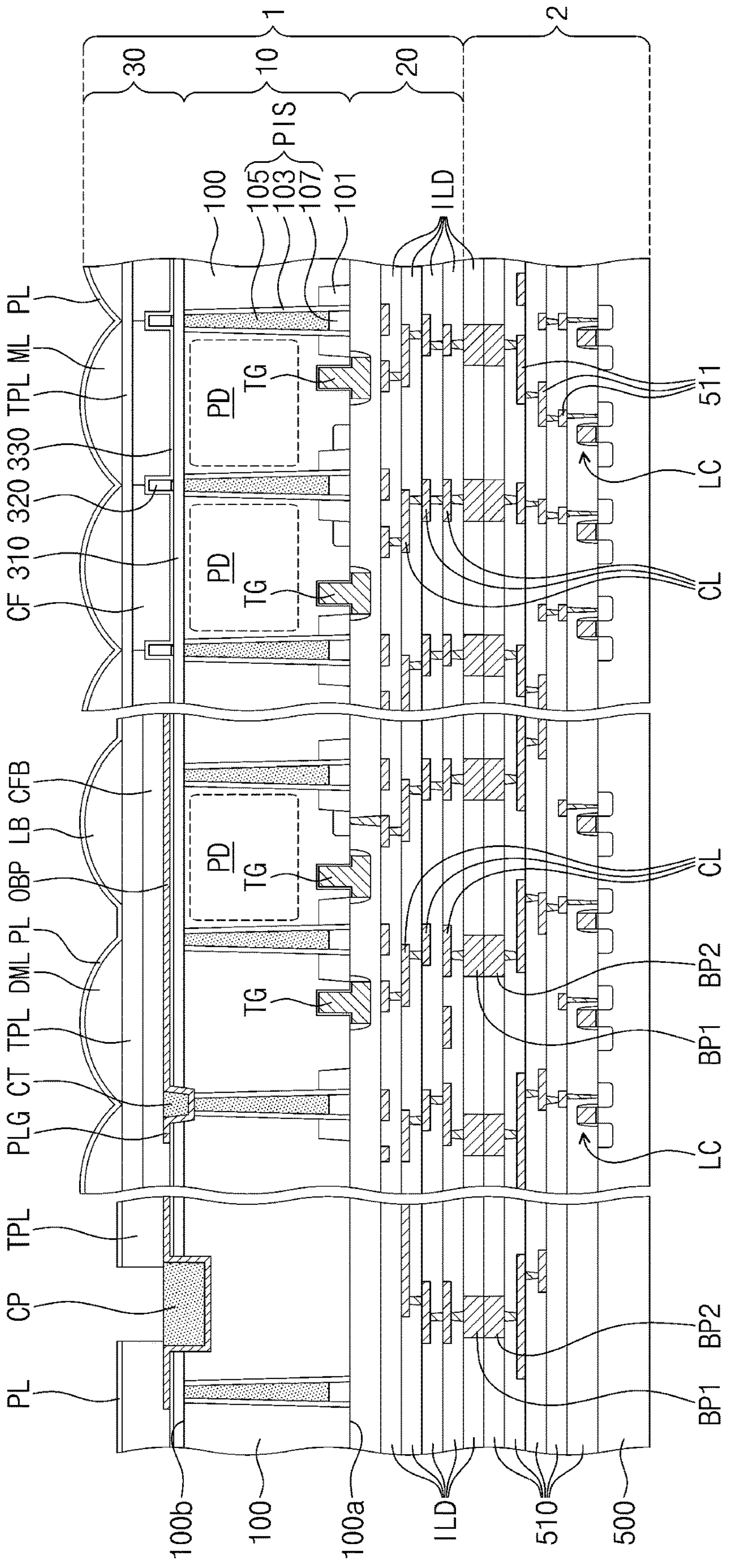
Figure 7:
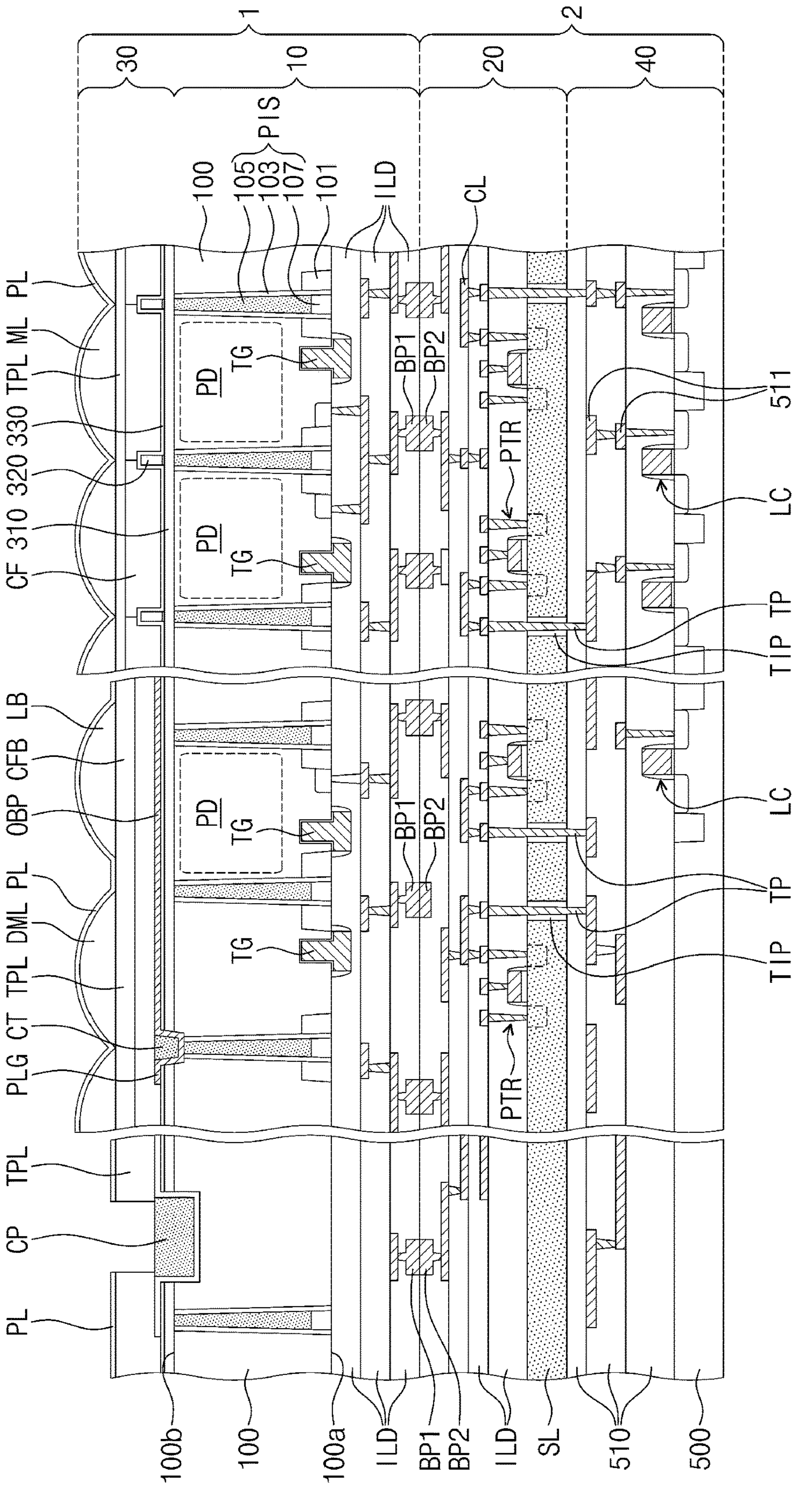

FIGS. 5, 6 and 7 are cross-sectional views illustrating portions of image sensor chips according to some embodiments of the inventive concepts.

Referring to FIG. 5, an image sensor chip C1 may include a sensor part 1 and a logic part 2.

The sensor part 1 may include a photoelectric conversion layer 10 between a readout circuit layer 20 and a light transmitting layer 30 when viewed in a vertical view, as described above. The photoelectric conversion layer 10 of the sensor part 1 may include a semiconductor substrate 100, a pixel isolation structure PIS, and photoelectric conversion regions PD.

The semiconductor substrate 100 may have a first surface (or a front surface) 100*a* and a second surface (or a back surface) 100*b*, which are opposite to each other. The semiconductor substrate 100 may be a substrate in which an epitaxial layer having a first conductivity type (e.g., a p-type) is formed on a bulk silicon substrate having the first conductivity type or may be a substrate in which the p-type epitaxial layer remains by removing the bulk silicon substrate in a process of manufacturing an image sensor chip. Alternatively, the semiconductor substrate 100 may be a bulk semiconductor substrate including a well having the first conductivity type.

The semiconductor substrate 100 may include the pixel isolation structure PIS defining pixel regions, and the photoelectric conversion regions PD provided in the pixel regions. The pixel isolation structure PIS may have substantially the same structure in the light receiving region AR and the light blocking region OB.

A device isolation layer 101 may be disposed adjacent to the first surface 100*a* of the semiconductor substrate 100 in each of the pixel regions. The device isolation layer 101 may define active portions at the first surface 100*a* of the semiconductor substrate 100. The device isolation layer 101 may be provided in a device isolation trench formed by recessing the first surface 100*a* of the semiconductor substrate 100. The device isolation layer 101 may be formed of an insulating material.

The pixel isolation structure PIS may be disposed in the semiconductor substrate 100 to define a plurality of the pixel regions. The pixel isolation structure PIS may vertically extend from the first surface 100*a* to the second surface 100*b* of the semiconductor substrate 100. The pixel isolation structure PIS may penetrate a portion of the device isolation layer 101.

The pixel isolation structure PIS may include first portions extending in a first direction in parallel to each other, and second portions extending in a second direction in parallel to each other to intersect the first portions. The pixel isolation structure PIS may surround each of the photoelectric conversion regions PD when viewed in a plan view.

The pixel isolation structure PIS may have a length in a direction perpendicular to a surface (i.e., the first or second surface 100*a* or 100*b*) of the semiconductor substrate 100. The length of the pixel isolation structure PIS may be substantially equal to a vertical thickness of the semiconductor substrate 100.

The pixel isolation structure PIS may include a liner insulating pattern 103, a semiconductor pattern 105, and a filling insulation pattern 107.

The liner insulating pattern 103 may be provided between the semiconductor pattern 105 and the semiconductor substrate 100. The liner insulating pattern 103 may be in direct contact with the semiconductor substrate 100. The liner insulating pattern 103 may include a material having a refractive index lower than that of the semiconductor substrate 100.

The semiconductor pattern 105 may include a crystalline semiconductor material such as polysilicon. For example, the semiconductor pattern 105 may further include dopants, and the dopants may include dopants having the first conductivity type or dopants having the second conductivity type. The semiconductor pattern 105 may be formed of an undoped polysilicon layer, a doped polysilicon layer, air, or a combination thereof.

The filling insulation pattern 107 may be disposed on a top or bottom surface of the semiconductor pattern 105, and a top surface of the filling insulation pattern 107 may be located at substantially the same vertical level as a top surface of the device isolation layer 101. A bottom surface of the filling insulation pattern 107 may be located at substantially the same vertical level as or a lower vertical level than a bottom surface of the device isolation layer 101.

The semiconductor pattern 105 of the pixel isolation structure PIS may have a single body provided in an entire region of the pixel array region R1. In other words, the semiconductor pattern 105 may have a single body provided in common in the light receiving region AR and the light blocking region OB.

The semiconductor pattern 105 may be connected to a bias contact plug PLG in the light blocking region OB. The bias contact plug PLG may have a width greater than a width of the pixel isolation structure PIS. The bias contact plug PLG may include a metal and/or a metal nitride. For example, the bias contact plug PLG may include titanium and/or titanium nitride.

A contact pattern CT may fill a contact hole in which the bias contact plug PLG is formed. The contact pattern CT may include a material different from that of the bias contact plug PLG. For example, the contact pattern CT may include aluminum (Al).

A negative bias may be applied to the semiconductor pattern 105 through the contact pattern CT and the bias contact plug PLG. The negative bias may be transmitted from the light blocking region OB to the light receiving region AR. Since the negative bias is applied to the semiconductor pattern 105 of the pixel isolation structure PIS, it is possible to reduce a dark current occurring at a boundary between the pixel isolation structure PIS and the semiconductor substrate 100.

The photoelectric conversion regions PD may be provided in the pixel regions of the light blocking region OB and the light receiving region AR, respectively. The photoelectric conversion regions PD may be formed by ion-implanting dopants having the second conductivity type opposite to the first conductivity type of the semiconductor substrate 100 into the semiconductor substrate 100. A photodiode may be formed by a junction between the semiconductor substrate 100 having the first conductivity type and the photoelectric conversion region PD having the second conductivity type. The photoelectric conversion regions PD may generate photo charges in proportion to an intensity of incident light.

Reference pixels to which light is not incident may be provided in the light blocking region OB, and magnitudes of electrical signals sensed from the unit pixels may be calculated by comparing the amount of reference charges generated from the reference pixels with the amount of charges sensed from the unit pixels of the light receiving region AR.

The readout circuit layer 20 may be disposed on the first surface 100*a* of the semiconductor substrate 100. The readout circuit layer 20 may include pixel transistors (e.g., MOS transistors) electrically connected to the photoelectric conversion regions PD. The readout circuit layer 20 may include a reset transistor, a selection transistor, a dual conversion gain transistor and a source follower transistor, which are electrically connected to the photoelectric conversion region PD of each of the unit pixels.

In each of the pixel regions, transfer gate electrodes TG may be disposed on the first surface 100*a* of the semiconductor substrate 100. The transfer gate electrode TG may be disposed in a central portion of each of the pixel regions when viewed in a plan view. A portion of the transfer gate electrode TG may be disposed in the semiconductor substrate 100, and a gate insulating layer may be disposed between the transfer gate electrode TG and the semiconductor substrate 100. The gate insulating layer may be formed of a silicon oxide layer, a silicon oxynitride layer, a high-k dielectric layer having a dielectric constant higher than that of a silicon oxide layer, or a combination thereof.

A floating diffusion region may be provided in the semiconductor substrate 100 at a side of the transfer gate electrode TG. The floating diffusion region may be formed by ion-implanting dopants having a conductivity type opposite to that of the semiconductor substrate 100. For example, the floating diffusion region may be an n-type dopant region.

For example, the transfer gate electrode TG and pixel gate electrodes may include doped poly-silicon, a metal, a conductive metal nitride, a conductive metal silicide, a conductive metal oxide, or a combination thereof.

The interlayer insulating layers ILD may cover the transfer gate electrodes TG and the pixel gate electrodes on the first surface 100*a* of the semiconductor substrate 100.

An interconnection structure connected to the readout circuits may be disposed in the interlayer insulating layers ILD. The interconnection structure may include connection lines CL and contact plugs connecting the connection lines CL.

The light transmitting layer 30 may be disposed on the second surface 100*b* of the semiconductor substrate 100. The light transmitting layer 30 may include a lower planarization insulating layer 310, a grid structure 320, a protective layer 330, color filters CF, a light blocking pattern OBP, micro lenses ML, at least two or more lens bar patterns LB, dummy micro lenses DML, and a passivation layer PL. The light transmitting layer 30 may concentrate and filter light incident from the outside and may provide the concentrated and filtered light to the photoelectric conversion layer 10.

The lower planarization insulating layer 310 may cover the second surface 100*b* of the semiconductor substrate 100. The lower planarization insulating layer 310 may be formed of a transparent insulating material and may include a plurality of layers. The lower planarization insulating layer 310 may be formed of an insulating material having a refractive index different from that of the semiconductor substrate 100. The lower planarization insulating layer 310 may include a metal oxide and/or silicon oxide.

The lower planarization insulating layer 310 may include a single layer or a multi-layer. For example, the lower planarization insulating layer 310 may include a metal oxide or metal fluoride including at least one metal selected from a group consisting of hafnium (Hf), zirconium (Zr), aluminum (Al), tantalum (Ta), titanium (Ti), yttrium (Y), and a lanthanoid (La). For example, the lower planarization insulating layer 310 may include an aluminum oxide layer and/or a hafnium oxide layer.

The lower planarization insulating layer 310 may extend from the light receiving region AR into the light blocking region OB and the pad region R2.

The grid structure 320 may be disposed on the lower planarization insulating layer 310. Like the pixel isolation structure PIS, the grid structure 320 may have a grid or lattice shape when viewed in a plan view. The grid structure 320 may overlap with the pixel isolation structure PIS when viewed in a plan view. In other words, the grid structure 320 may include first portions extending in the first direction, and second portions intersecting the first portions and extending in the second direction. A width of the grid structure 320 may be substantially equal to or less than a minimum width of the pixel isolation structure PIS.

The grid structure 320 may include a conductive pattern and/or a low-refractive index pattern. For example, the conductive pattern may include a metal material such as titanium, tantalum or tungsten. The low-refractive index pattern may be formed of a material having a refractive index lower than that of the conductive pattern. The low-refractive index pattern may be formed of an organic material and may have a refractive index of about 1.1 to about 1.3. For example, the grid structure 320 may include a polymer layer including silica nanoparticles.

The protective layer 330 may have a substantially uniform thickness and may cover a surface of the grid structure 320 on the lower planarization insulating layer 310. For example, the protective layer 330 may include a single layer or multi-layer of at least one of an aluminum oxide layer or a silicon oxycarbide layer. The protective layer 330 may extend from the light receiving region AR into the light blocking region OB and the pad region R2.

The color filters CF may be formed to correspond to the pixel regions, respectively. The color filters CF may be in or fill spaces defined by the grid structure 320. Depending on properties of the unit pixel, each of the color filters CF may include a red, green or blue color filter or may include a magenta, cyan or yellow color filter.

The micro lenses ML may be disposed on the color filters CF. Each of the micro lenses ML may have a convex shape and may have a specific radius of curvature. The micro lenses ML may be formed of a transparent resin.

In the light blocking region OB, the light blocking pattern OBP may be disposed on the lower planarization insulating layer 310 or the protective layer 330. The light blocking pattern OBP may prevent light from being incident into the photoelectric conversion regions PD provided in the light blocking region OB. The photoelectric conversion regions PD in reference pixel regions of the light blocking region OB may not output photoelectric signals but may output noise signals. The noise signals may be generated by electrons generated by generated heat or a dark current. For example, the light blocking pattern OBP may include a metal such as tungsten, copper, aluminum, or any alloy thereof.

In the light blocking region OB, a first through-conductive pattern 531 may penetrate the semiconductor substrate 100 so as to be electrically connected to the interconnection structure of the readout circuit layer 20 and an interconnection structure 511 of the logic part 2. The first through-conductive pattern 531 may have a first bottom surface and a second bottom surface, which are located at different vertical levels. A first filling pattern 541 may be provided in a space surrounded by the first through-conductive pattern 531. The first filling pattern 541 may include a low-refractive index material and may have an insulating property.

In the pad region R2, the conductive pads CP may be provided at the second surface **100*b* of the semiconductor substrate 100. The conductive pads CP may be at least partially buried in the second surface 100*b* of the semiconductor substrate 100. For example, each of the conductive pads CP may be provided in a pad trench formed in the second surface 100*b* of the semiconductor substrate 100** in the pad region R2. The conductive pads CP may include a metal such as aluminum, copper, tungsten, titanium, tantalum, or any alloy thereof. In a mounting process of the image sensor chip, bonding wires may be bonded to the conductive pads CP. The conductive pads CP may be electrically connected to an external device through the bonding wires.

In the pad region R2, a second through-conductive pattern 533 may penetrate the semiconductor substrate 100 so as to be electrically connected to one of the interconnection structures 511 of the logic part 2. The second through-conductive pattern 533 may extend onto the second surface **100*b* of the semiconductor substrate 100 so as to be electrically connected to the conductive pads CP. A portion of the second through-conductive pattern 533 may cover a bottom surface and a side surface of the conductive pad CP. A second filling pattern 543 may be provided in a space surrounded by the second through-conductive pattern 533. The second filling pattern 543 may include a low-refractive index material and may have an insulating property. In the pad region R2, the pixel isolation structure PIS may be provided around the second through-conductive pattern 533**.

A bulk filtering layer CFB may be provided on the light blocking pattern OBP. The bulk filtering layer CFB may block light having a different wavelength from those of the color filters CF. For example, the bulk filtering layer CFB may block infrared light. The bulk filtering layer CFB may include, but not limited to, a blue color filter.

The upper planarization layer TPL may cover the color filters CF and the bulk filtering layer CFB in the pixel array region R1. The upper planarization layer TPL may expose top surfaces of the conductive pads CP in the pad region R2.

As described above, the micro lenses ML may be disposed on the upper planarization layer TPL in the light receiving region AR, and the lens bar patterns LB and the dummy micro lenses DML may be disposed on the upper planarization layer TPL in the light blocking region OB.

The logic part 2 may be disposed adjacent to the readout circuit layer 20 of the sensor part 1. The logic part 2 may include a power circuit, an input/output interface, and an image signal processor.

The logic part 2 may include a logic semiconductor substrate 500, logic circuits LC, the interconnection structures 511 connected to the logic circuits LC, and logic interlayer insulating layers 510. An uppermost one of the logic interlayer insulating layers 510 may be bonded to the readout circuit layer 20 of the sensor part 1. The logic part 2 may be electrically connected to the sensor part 1 through the first through-conductive pattern 531 and the second through-conductive pattern 533.

The sensor part 1 and the logic part 2 are electrically connected to each other through the first and second through-conductive patterns 531 and 533 in the present embodiments, but embodiments of the inventive concepts are not limited thereto.

According to embodiments illustrated in FIG. 6, the first and second through-conductive patterns of FIG. 5 may be omitted, and bonding pads BP1 and BP2 provided in uppermost metal layers of the sensor part 1 and the logic part 2 may be directly bonded to each other to electrically connect the sensor part 1 and the logic part 2 to each other.

More particularly, the sensor part 1 of the image sensor chip may include first bonding pads BP1 provided in an uppermost or lowermost metal layer of the readout circuit layer 20, and the logic part 2 may include second bonding pads BP2 provided in an uppermost metal layer of the interconnection structure 511. For example, the first and second bonding pads BP1 and BP2 may include at least one of tungsten (W), aluminum (Al), copper (Cu), tungsten nitride (WN), tantalum nitride (TaN), or titanium nitride (TiN).

The first bonding pads BP1 of the sensor part 1 may be electrically connected directly to the second bonding pads BP2 of the logic part 2 by a hybrid bonding method. The hybrid bonding may mean a bonding method in which two components including the same kind of a material are fused into one at their interface. For example, when the first and second bonding pads BP1 and BP2 are formed of copper (Cu), the first and second bonding pads BP1 and BP2 may be physically and electrically connected to each other by a copper (Cu)-copper (Cu) bonding method. In addition, a surface of an insulating layer of the sensor part 1 and a surface of an insulating layer of the logic part 2 may be bonded to each other by a dielectric-dielectric bonding method.

According to embodiments illustrated in FIG. 7, a sensor part 1 may include a photoelectric conversion layer 10 and a light transmitting layer 30, and a logic part 2 may include a readout circuit layer 20 and a logic circuit layer 40.

The photoelectric conversion layer 10 may include first bonding pads BP1 provided in an uppermost or lowermost metal layer. Here, the first bonding pads BP1 may be connected to the transfer gate electrodes TG, the floating diffusion regions and ground dopant regions through contact plugs and connection lines.

The logic circuit layer 40 may include the logic semiconductor substrate 500, the logic circuits LC, the interconnection structures 511 connected to the logic circuits LC, and the logic interlayer insulating layers 510.

A semiconductor layer SL of the readout circuit layer 20 may be disposed on the logic interlayer insulating layer 510. The readout circuit layer 20 may include the semiconductor layer SL, through-insulating patterns TIP, pixel transistors PTR, and interlayer insulating layers ILD. The readout circuit layer 20 may be electrically connected to the logic circuits LC of the logic circuit layer 40 through through-plugs TP.

In addition, the readout circuit layer 20 may include second bonding pads BP2 provided in an uppermost metal layer. The second bonding pads BP2 may be directly bonded to the first bonding pads BP1 of the photoelectric conversion layer 10.

The readout circuit layer 20 may include the semiconductor layer SL on an uppermost one of the logic interlayer insulating layers 510, the pixel transistors PTR provided on the semiconductor layer SL, and the interlayer insulating layers ILD. The pixel transistors PTR may be connected to the photoelectric conversion layer 10 through the through-plugs TP and connection lines.

The semiconductor layer SL may partially overlap with at least one of the photoelectric conversion regions PD.

The through-insulating pattern TIP may penetrate the semiconductor layer SL. A top surface of the through-insulating pattern TIP may be coplanar or substantially coplanar with a top surface of the semiconductor layer SL. For example, the through-insulating pattern TIP may include silicon oxide, silicon nitride, and/or silicon oxynitride.

The pixel transistors PTR may be provided on the semiconductor layer SL. The pixel transistors PTR may include reset transistors, source follower transistors, dual conversion gain transistors and selection transistors, which are electrically connected to the photoelectric conversion regions PD.

Each of the pixel transistors PTR may include a pixel gate electrode, and source/drain regions provided in the semiconductor layer SL at both sides of the pixel gate electrode.

The through-plugs TP may penetrate the interlayer insulating layers ILD and the through-insulating patterns TIP of the readout circuit layer 20 and may be electrically connected to the logic circuits LC of the logic circuit layer 40.

The second bonding pads BP2 of the readout circuit layer 20 may be electrically connected directly to the first bonding pads BP1 of the sensor part 1 by a hybrid bonding method.

Figure 8:
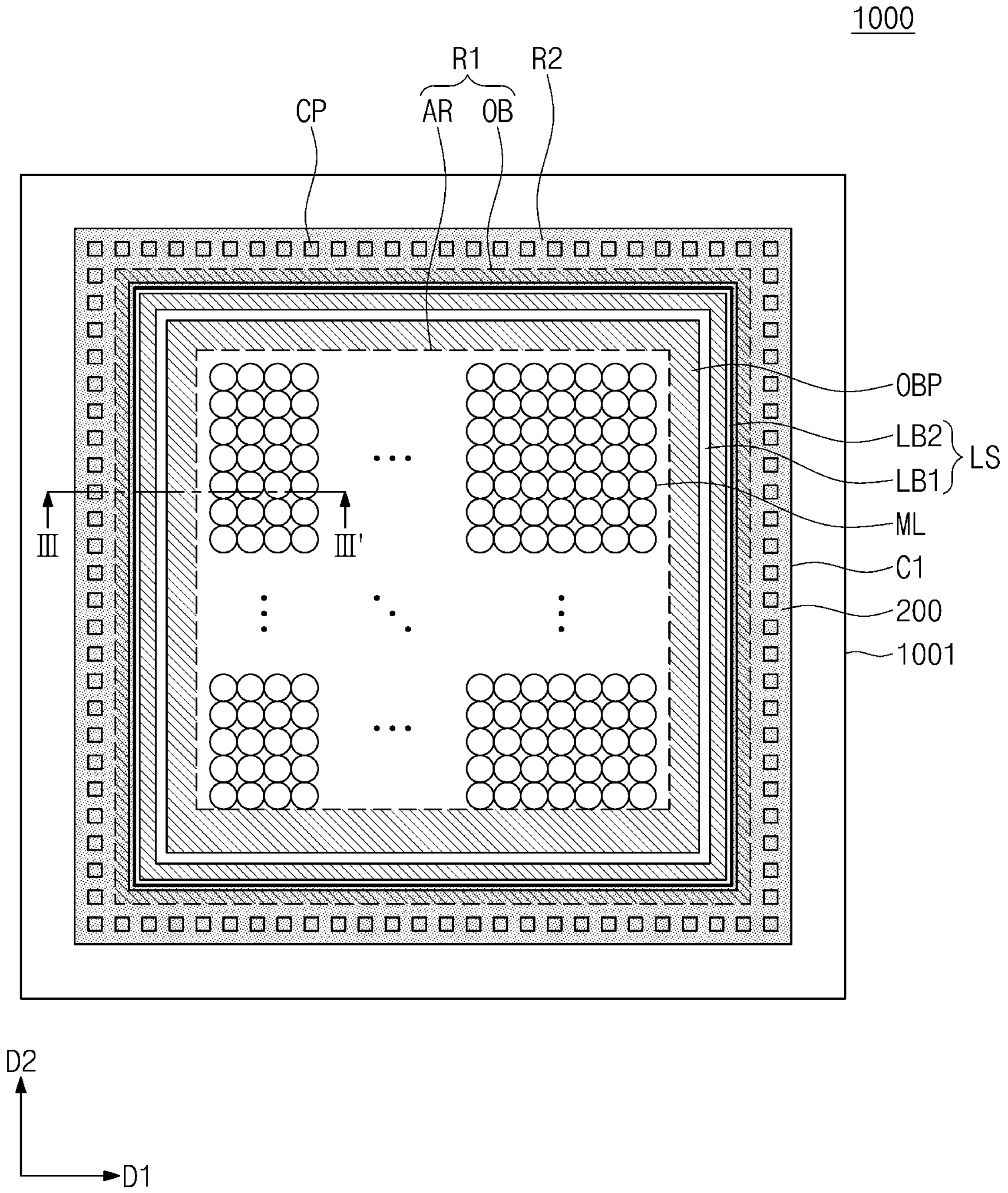
FIGS. 8, 10, 12, 14 and 16 are plan views illustrating semiconductor packages according to some embodiments of the inventive concepts.
Figure 9:
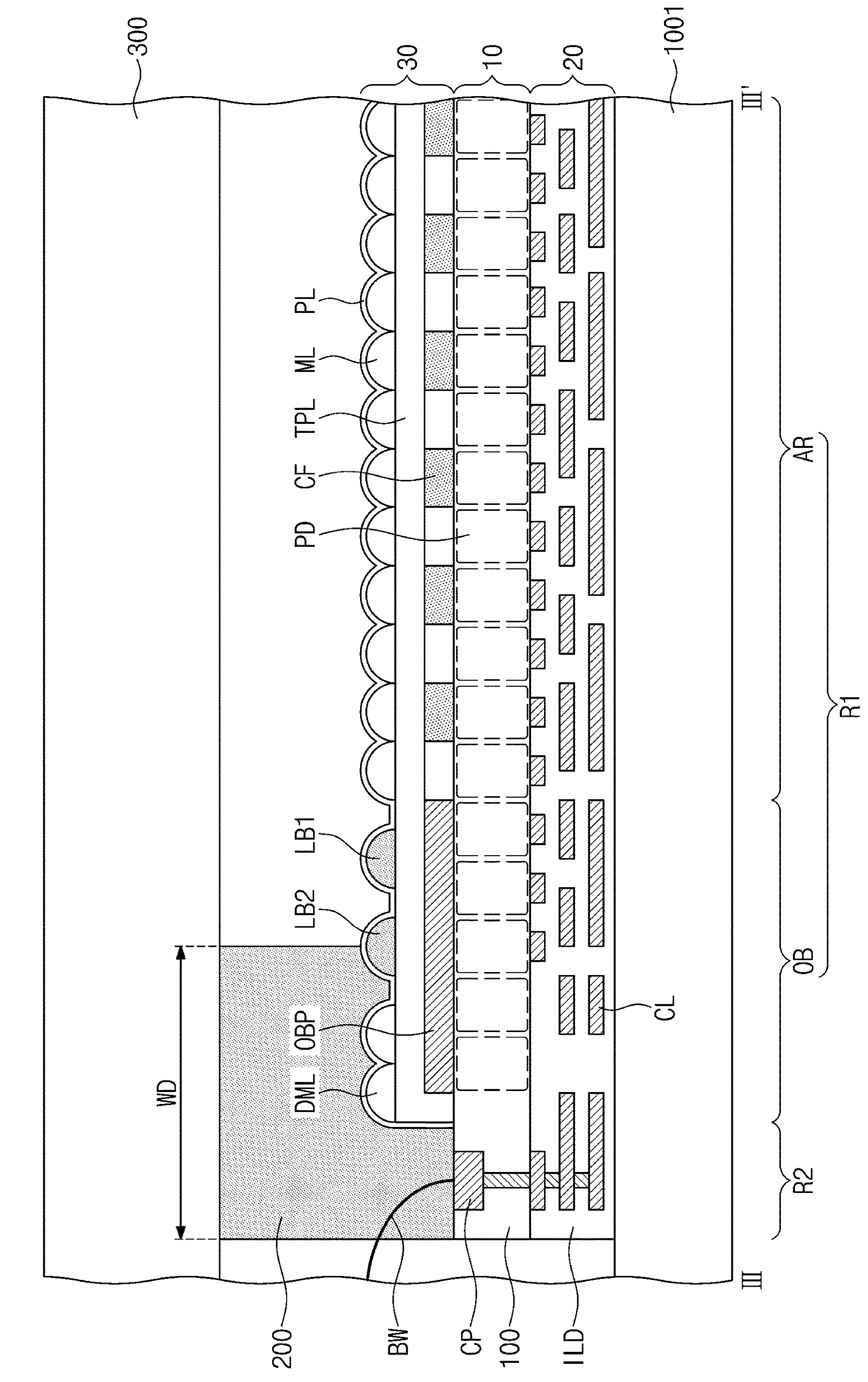
FIGS. 9, 11, 13, 15 and 17 are cross-sectional views taken along lines III-III' of FIGS. 8, 10, 12, 14 and 16, respectively, to illustrate semiconductor packages according to some embodiments of the inventive concepts.

FIG. 8 is a plan view illustrating a semiconductor package according to some embodiments of the inventive concepts. FIG. 9 is a cross-sectional view taken along a line III-III' of FIG. 8 to illustrate a semiconductor package according to some embodiments of the inventive concepts.

Referring to FIGS. 8 and 9, as described above with reference to FIGS. 1 and 2, the semiconductor package 1000 according to some embodiments of the inventive concepts may include the package substrate 1001, the image sensor chip C1, the dam structure 200, the transparent substrate 300, and the molding layer 400.

As described with reference to FIGS. 3 to 7, the image sensor chip C1 may include the pixel array region R1 including the light receiving region AR and the light blocking region OB, and the pad region R2 around the pixel array region R1 when viewed in a plan view. In addition, the image sensor chip C1 may include the photoelectric conversion layer 10, the readout circuit layer 20, and the light transmitting layer 30 when viewed in a vertical view.

As described above, the photoelectric conversion layer 10 may include the photoelectric conversion regions PD provided in the semiconductor substrate 100 in the pixel array region R1, and the readout circuit layer 20 may include the pixel transistors electrically connected to the photoelectric conversion regions PD, the connection lines CL, and the interlayer insulating layers ILD.

As described above, the light transmitting layer 30 may include the color filters CF, the light blocking pattern OBP, the upper planarization layer TPL, the micro lenses ML, the lens structure LS, the dummy micro lenses DML, and the passivation layer PL.

The lens structure LS may include the first and second lens bar patterns LB1 and LB2 spaced apart from each other in the light blocking region OB. The first lens bar pattern LB1 may be closer to the light receiving region AR than the second lens bar pattern LB2. Each of the first and second lens bar patterns LB1 and LB2 may have a closed-curve or continuous shape surrounding the light receiving region AR when viewed in a plan view.

The dummy micro lenses DML having the same size as the micro lenses ML may be arranged on an outermost portion of the upper planarization layer TPL. The dummy micro lenses DML may be arranged between the second lens bar pattern LB2 and the conductive pads CP when viewed in a plan view.

The upper planarization layer TPL may expose the conductive pads CP disposed in the pad region R2. The conductive pads CP of the image sensor chip C1 may be connected to the bonding pads 1111 (see FIG. 1) of the package substrate 1001 through the bonding wires BW.

The dam structure 200 may be disposed between the image sensor chip C1 and the transparent substrate 300. The dam structure 200 may be disposed on the pad region R2 and a portion of the light blocking region OB of the image sensor chip C1.

For example, the dam structure 200 may cover the top surfaces of the conductive pads CP of the pad region R2 and may cover the dummy micro lenses DML and a portion of the second lens bar pattern LB2.

The dam structure 200 may have a smaller thickness on the light blocking region OB than on the pad region R2. The dam structure 200 may have a thickness range of about 10 μm to about 250 μm.

The dam structure 200 may have an outer side surface substantially aligned or coplanar with an outermost side surface of the image sensor chip C1, and an inner side surface defining an empty space between the image sensor chip C1 and the transparent substrate 300. The inner side surface of the dam structure 200 may be located on the second lens bar pattern LB2. In other words, the dam structure 200 may overlap or be aligned with a portion of the second lens bar pattern LB2.

A width WD of the dam structure 200 may correspond to a distance between the outer side surface and the inner side surface, and the width WD of the dam structure 200 may range from about 100 μm to about 450 μm.

The passivation layer PL may be disposed on a surface of the image sensor chip C1, and a portion of the passivation layer PL may be disposed between the dam structure 200 and the dummy micro lenses DML and between the dam structure 200 and the second lens bar pattern LB2.

According to some embodiments, the lens structure LS surrounding the light receiving region AR may be disposed in the light blocking region OB, and thus it is possible to prevent the organic material of the dam structure 200 from flowing into the light receiving region AR when the dam structure 200 is formed.

In addition, the lens structure LS and the dummy micro lenses DML may be formed in the light blocking region OB, and thus it is possible to prevent a crack phenomenon of the passivation layer PL, caused by a difference in thermal expansion coefficient between the passivation layer PL and the upper planarization layer TPL when the dam structure 200 is formed on the light blocking region OB.

FIGS. 10, 12, 14 and 16 are plan views illustrating semiconductor packages according to some embodiments of the inventive concepts. FIGS. 11, 13, 15 and 17 are cross-sectional views taken along lines III-III' of FIGS. 10, 12, 14 and 16, respectively, to illustrate semiconductor packages according to some embodiments of the inventive concepts. Hereinafter, the descriptions to the same features as mentioned in the above embodiments may be omitted and differences between the following embodiments and the above embodiments will be mainly described, for the purpose of ease and convenience in explanation.

Figure 10:
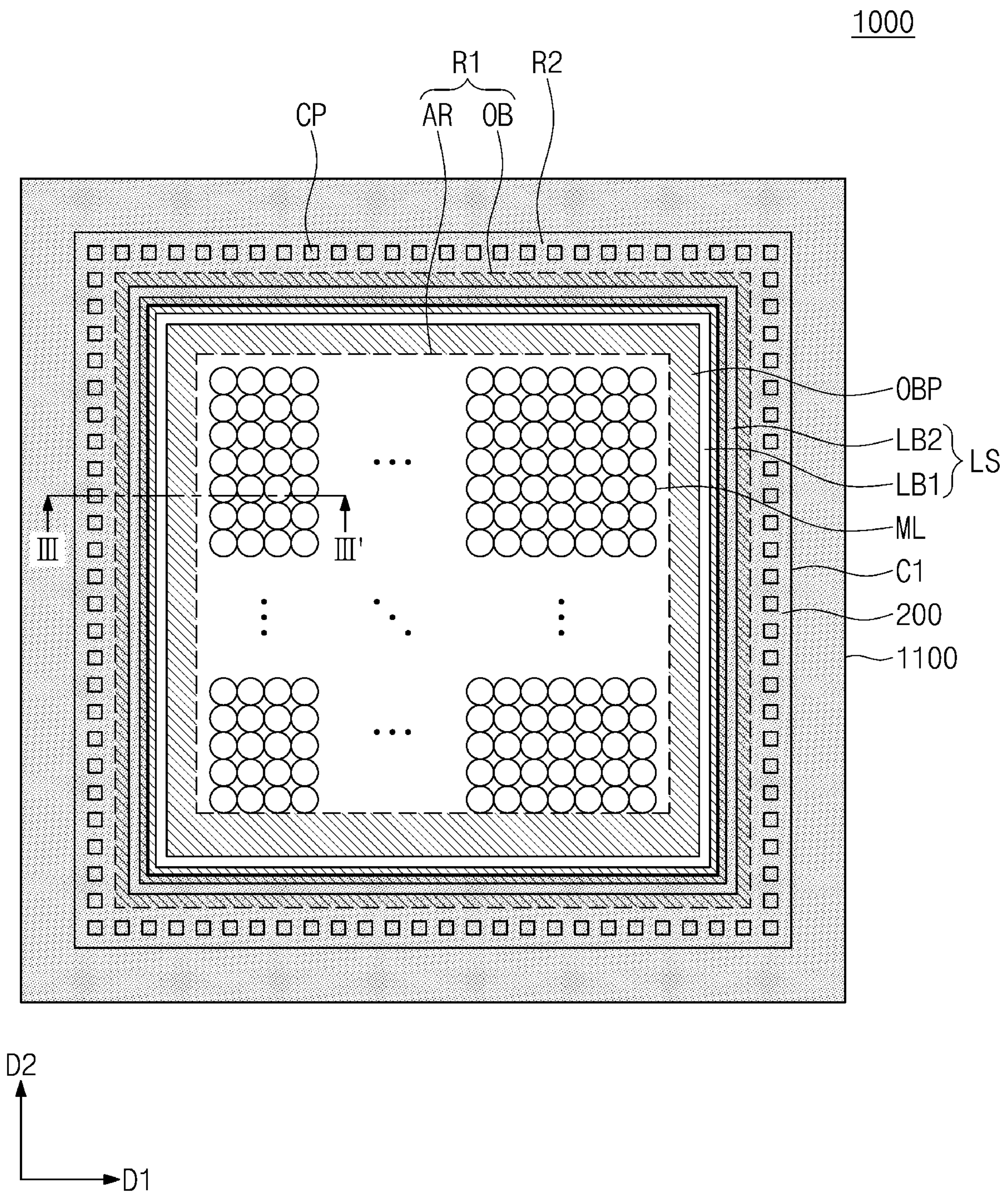
Figure 11:
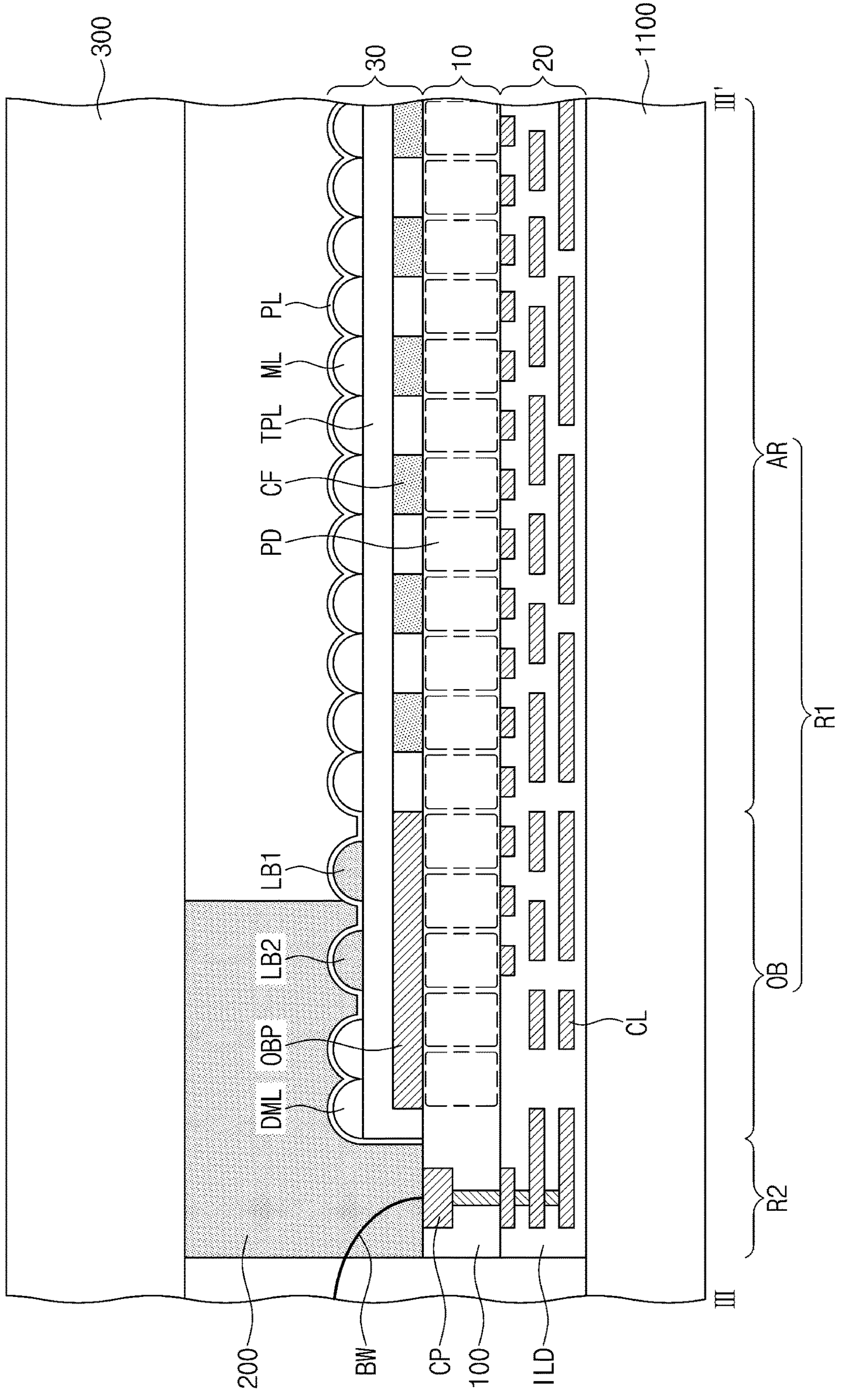

According to embodiments illustrated in FIGS. 10 and 11, the image sensor chip C1 may include the first and second lens bar patterns LB1 and LB2 which have the closed-curve or continuous shapes and are disposed on the upper planarization layer TPL in the light blocking region OB.

The dam structure 200 may be disposed on the pad region R2 and a portion of the light blocking region OB of the image sensor chip C1. The dam structure 200 may have an inner side surface between the first and second lens bar patterns LB1 and LB2. In other words, the dam structure 200 may completely overlap with the second lens bar pattern LB2.

Figure 12:
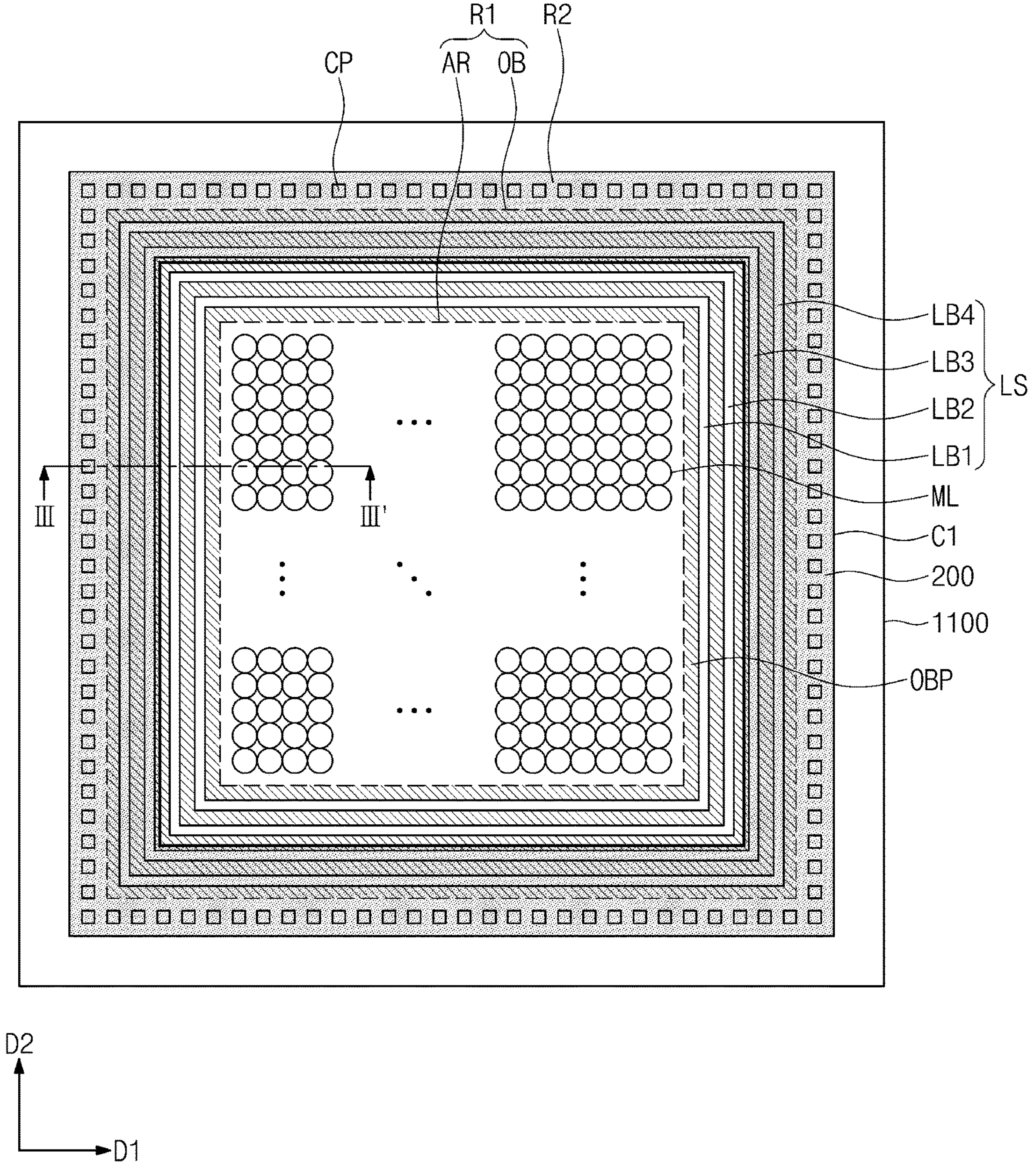
Figure 13:
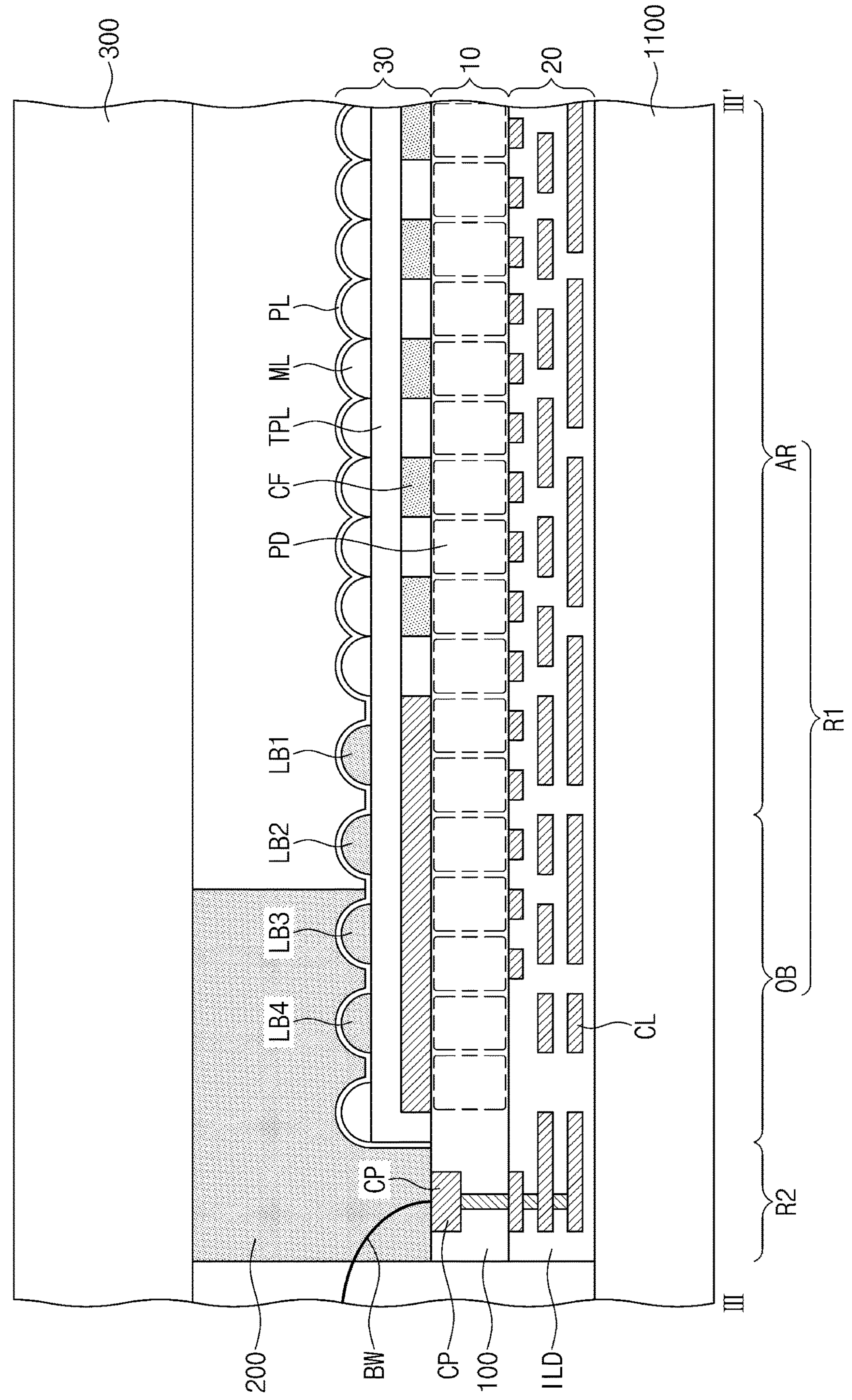

According to embodiments illustrated in FIGS. 12 and 13, a lens structure LS of the image sensor chip C1 may include first, second, third and fourth lens bar patterns LB1, LB2, LB3 and LB4. The first, second, third and fourth lens bar patterns LB1, LB2, LB3 and LB4 may be disposed on the upper planarization layer TPL in the light blocking region OB.

Each of the first, second, third and fourth lens bar patterns LB1, LB2, LB3 and LB4 may have a closed-curve or continuous shape when viewed in a plan view. The first lens bar pattern LB1 may surround the light receiving region AR, and the second lens bar pattern LB2 may be spaced apart from the first lens bar pattern LB1 and may surround the first lens bar pattern LB1. The third lens bar pattern LB3 may be spaced apart from the second lens bar pattern LB2 and may surround the second lens bar pattern LB2. The fourth lens bar pattern LB4 may be spaced apart from the third lens bar pattern LB3 and may surround the third lens bar pattern LB3.

The first, second, third and fourth lens bar patterns LB1, LB2, LB3 and LB4 may have substantially the same width in the first direction D1 and may be spaced apart from each other at equal distances.

The dam structure 200 may overlap with one or some of the first to fourth lens bar patterns LB1, LB2, LB3 and LB4. In other words, the dam structure 200 may completely cover the fourth lens bar pattern LB4 and may be spaced apart from the first lens bar pattern LB1 and, in some embodiments, may completely cover the third lens bar pattern LB3 and may be spaced apart from the second lens bar pattern LB2.

Figure 14:
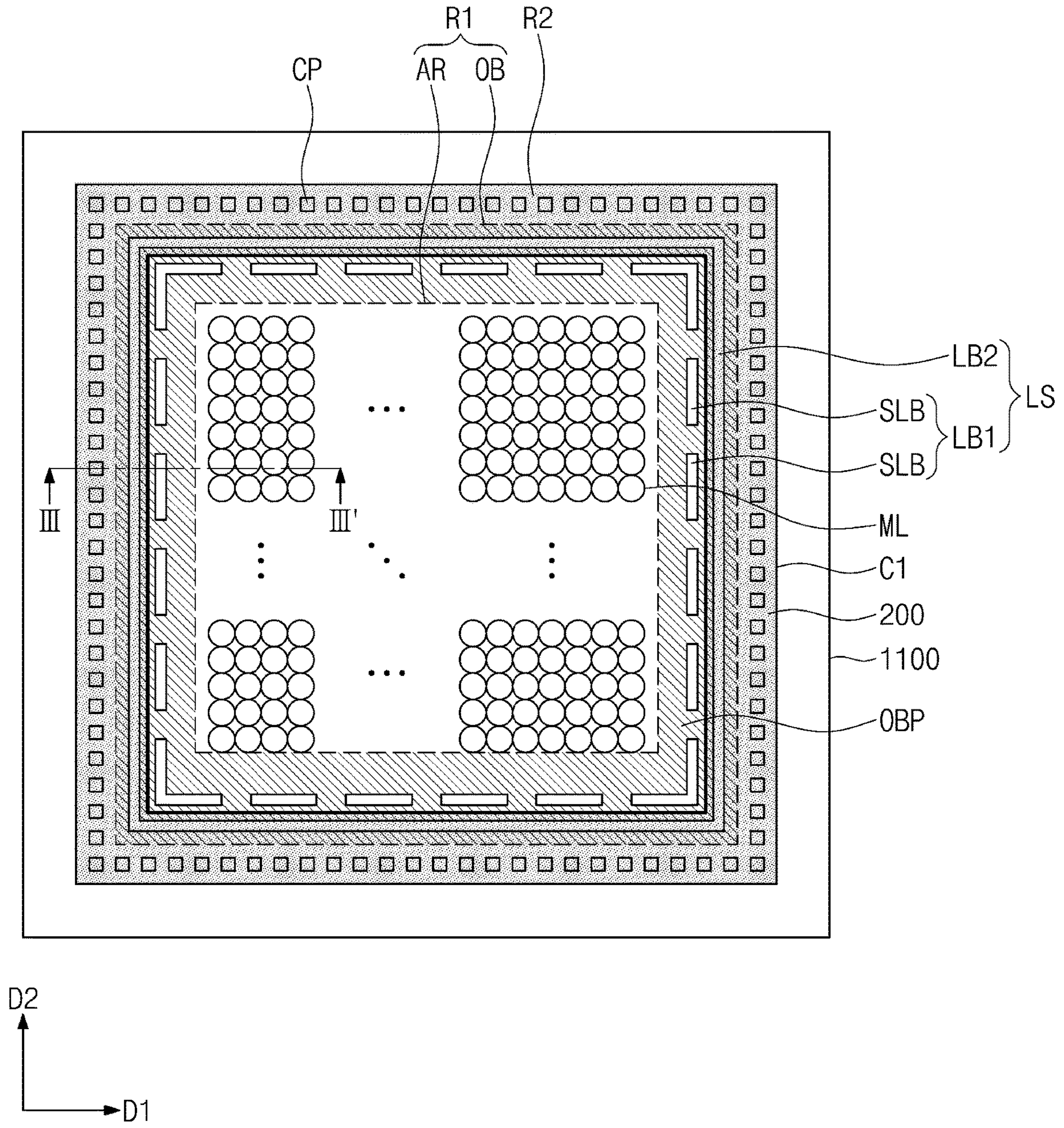
Figure 15:
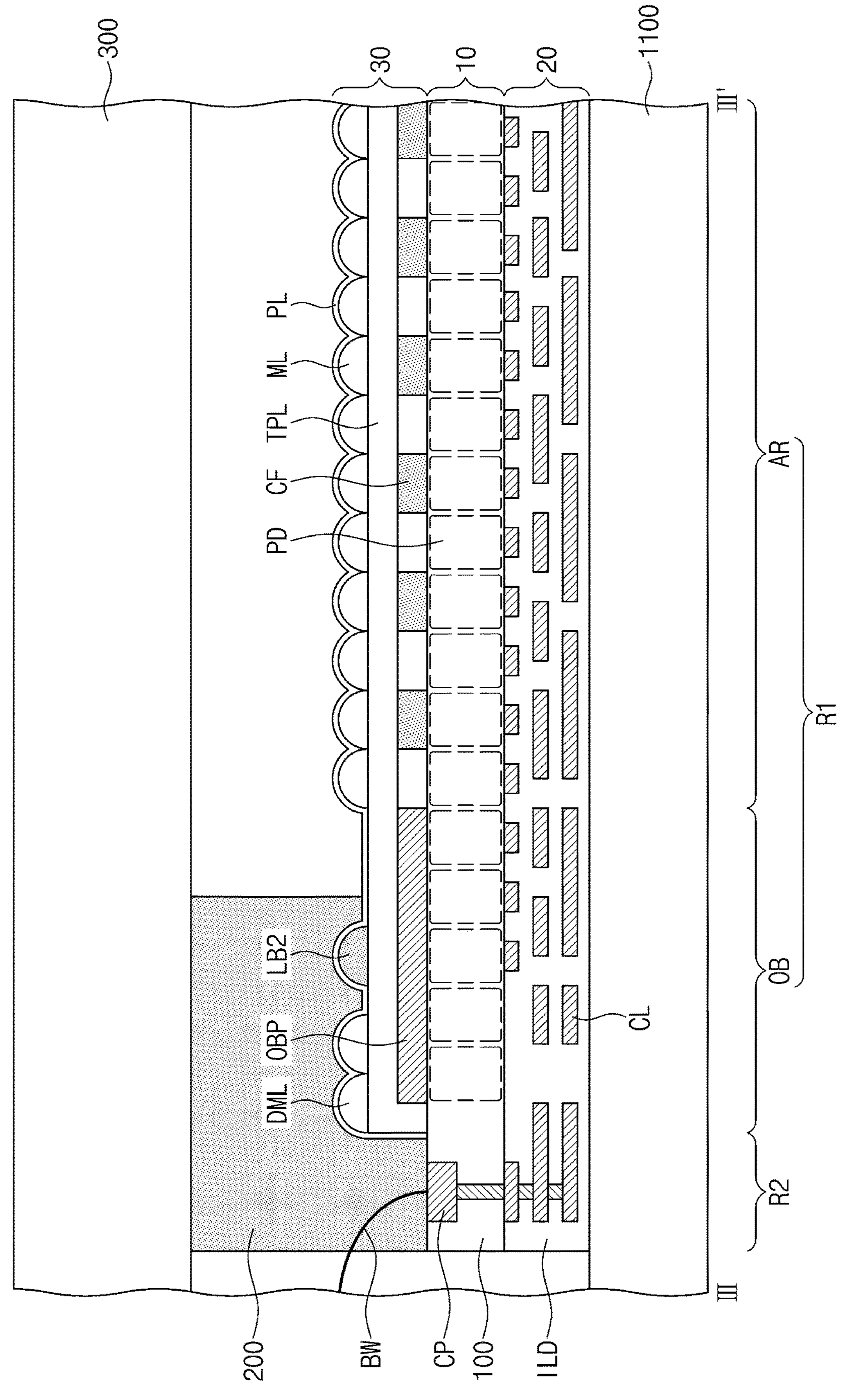

According to embodiments illustrated in FIGS. 14 and 15, a lens structure LS of the image sensor chip C1 may include first and second lens bar patterns LB1 and LB2. Here, the first lens bar pattern LB1 may include a plurality of sub-lens bar patterns SLB separated or spaced apart from each other, and the sub-lens bar patterns SLB may be arranged to surround the light receiving region AR. Each of the sub-lens bar patterns SLB may have a straight shape or L-shape when viewed in a plan view.

The second lens bar pattern LB2 may have a closed-curve or continuous shape and may surround the first lens bar pattern LB1.

The first lens bar pattern LB1 includes the plurality of sub-lens bar patterns SLB in the present embodiments, but embodiments of the inventive concepts are not limited thereto. In certain embodiments, the first lens bar pattern LB1 may have a closed-curve or continuous shape, and the second lens bar pattern LB2 may include a plurality of sub-lens bar patterns SLB.

Figure 16:
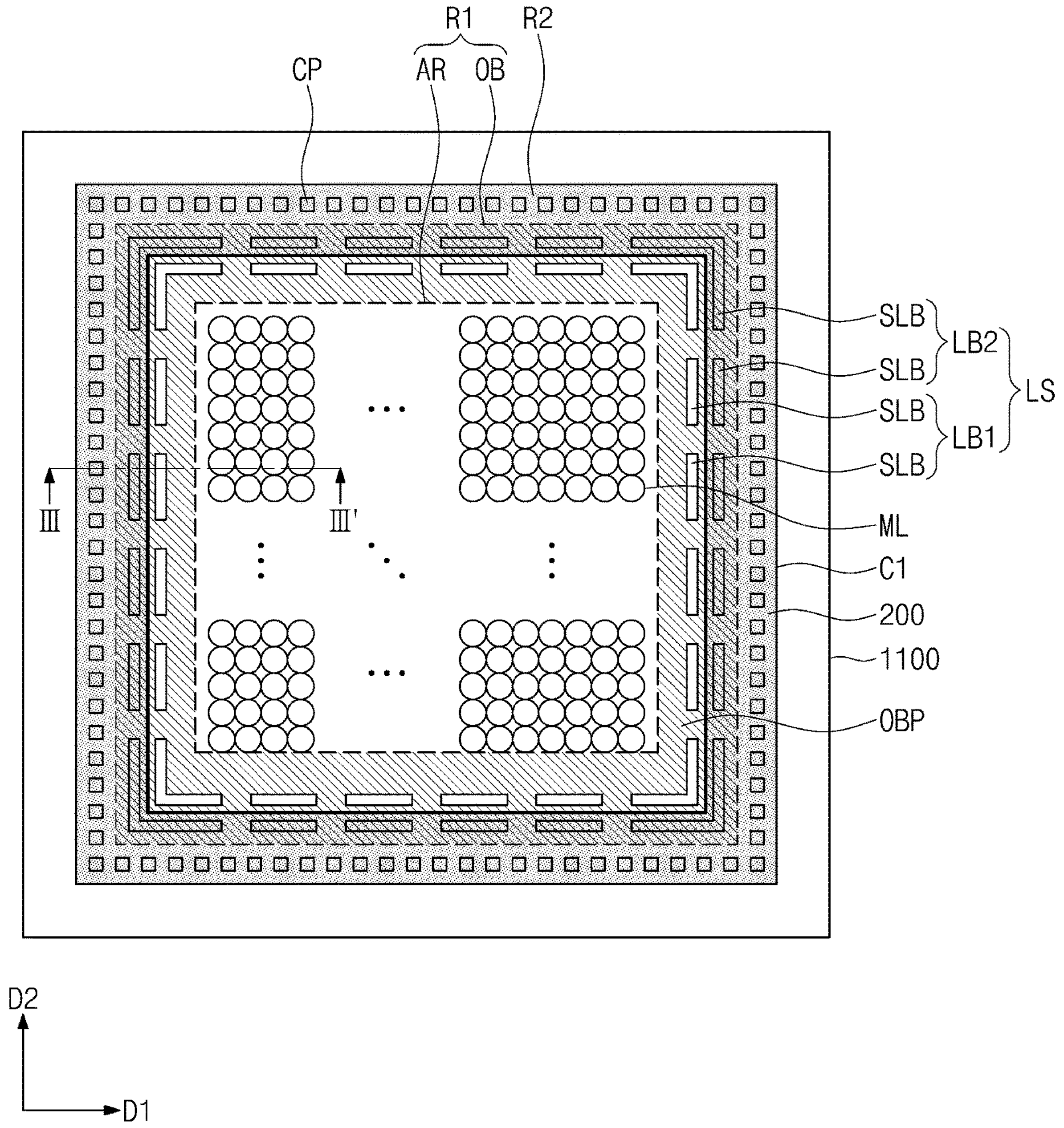
Figure 17:
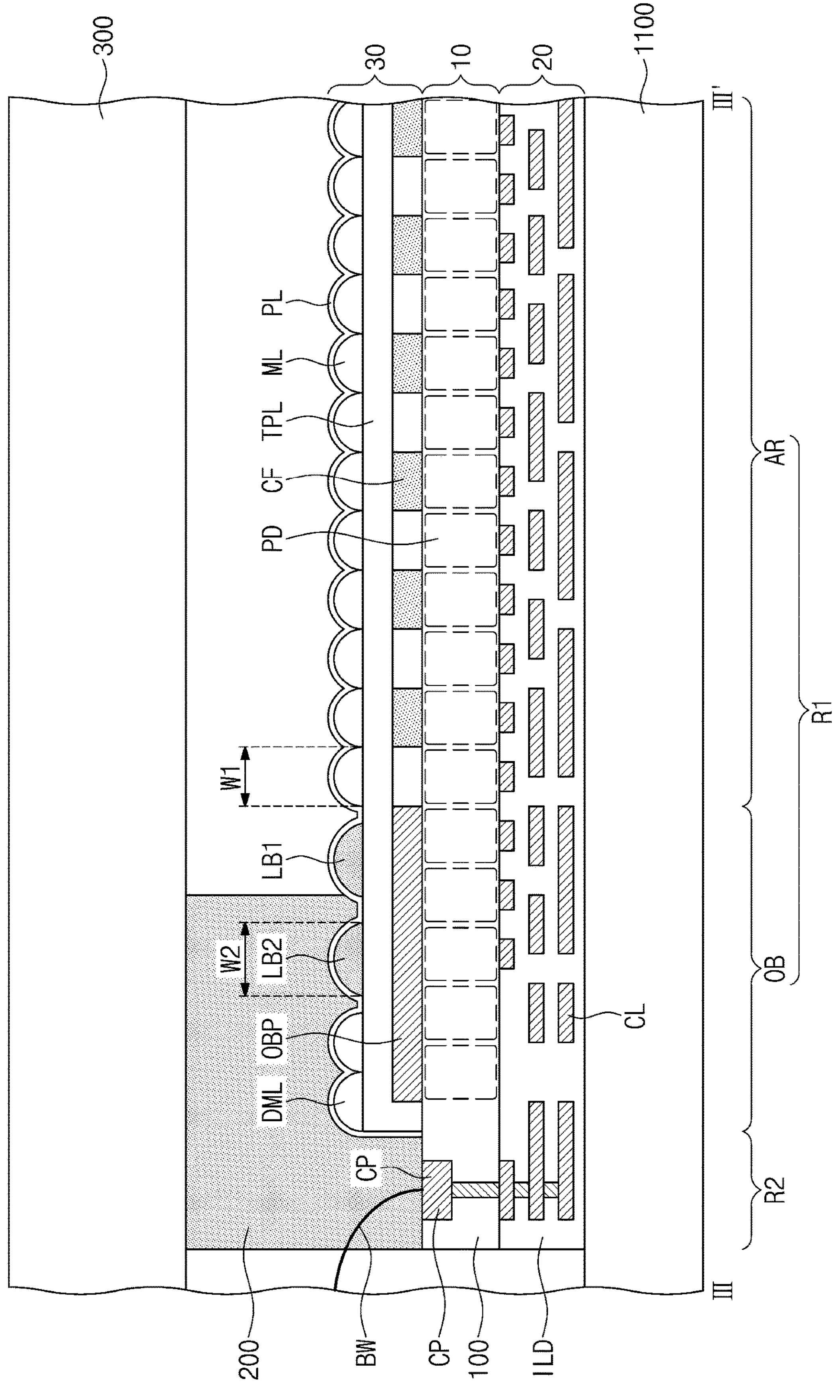

According to embodiments illustrated in FIGS. 16 and 17, a lens structure LS of the image sensor chip C1 may include first and second lens bar patterns LB1 and LB2. Here, each of the first and second lens bar patterns LB1 and LB2 may include a plurality of sub-lens bar patterns SLB separated from each other.

In addition, each of the first and second lens bar patterns LB1 and LB2 may have a width W2 in the first direction D1, which is greater than the width W1 of the micro lens ML in the first direction D1.

FIGS. 18 to 22 are cross-sectional views illustrating a method of manufacturing a semiconductor package according to some embodiments of the inventive concepts.

Figure 18:
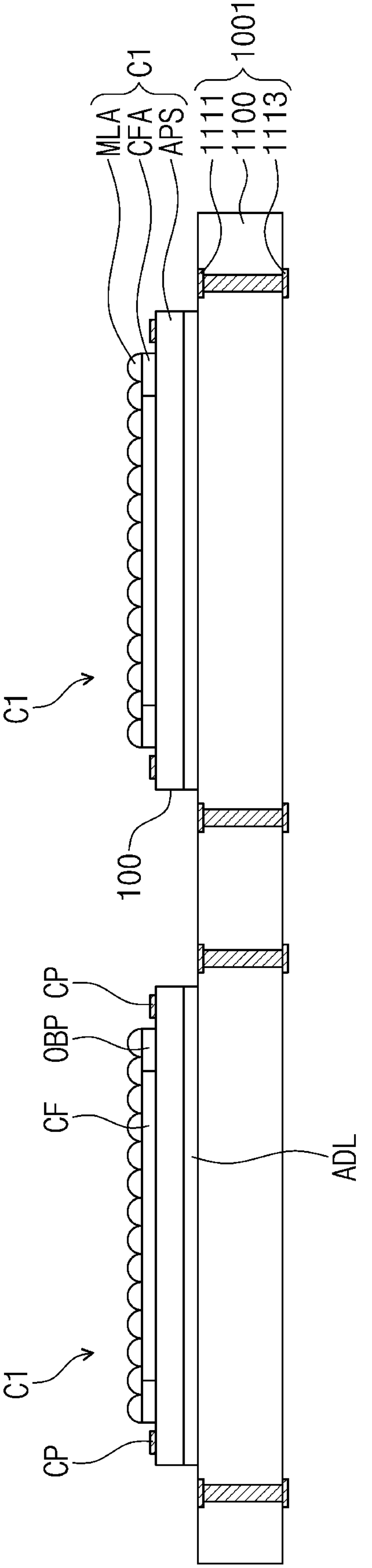
FIGS. 18 to 22 are cross-sectional views illustrating a method of manufacturing a semiconductor package according to some embodiments of the inventive concepts.

Referring to FIG. 18, a package substrate 1001 may be a printed circuit board (PCB). The package substrate 1001 may include the base substrate 1100, the bonding pads 1111 disposed at a top surface of the base substrate 1100, and the connection pads 1113 disposed at a bottom surface of the base substrate 1100, as described above.

An adhesive may be applied onto a top surface of the package substrate 1001 to form an adhesive layer ADL. The adhesive layer ADL may be formed on a central portion of the top surface of the package substrate 1001 to correspond to a mounting position of an image sensor chip C1.

In some embodiments, the adhesive layer ADL may be formed by applying a fluid adhesive through a dispenser and hardening the applied adhesive or may be formed by adhering an adhesive film to the central portion of the top surface of the package substrate 1001.

An image sensor chip C1 may be adhered and fixed onto the adhesive layer ADL. The image sensor chip C1 may include the semiconductor substrate 100 including the active pixel sensor array APS, the color filter layer CFA, and the micro lens layer MLA, as described above. The color filter layer CFA may include the color filters CF and the light blocking pattern OBP. The micro lens layer MLA may include the micro lenses ML, the lens structure LS, the dummy micro lenses DML, and the passivation layer PL.

Figure 19:
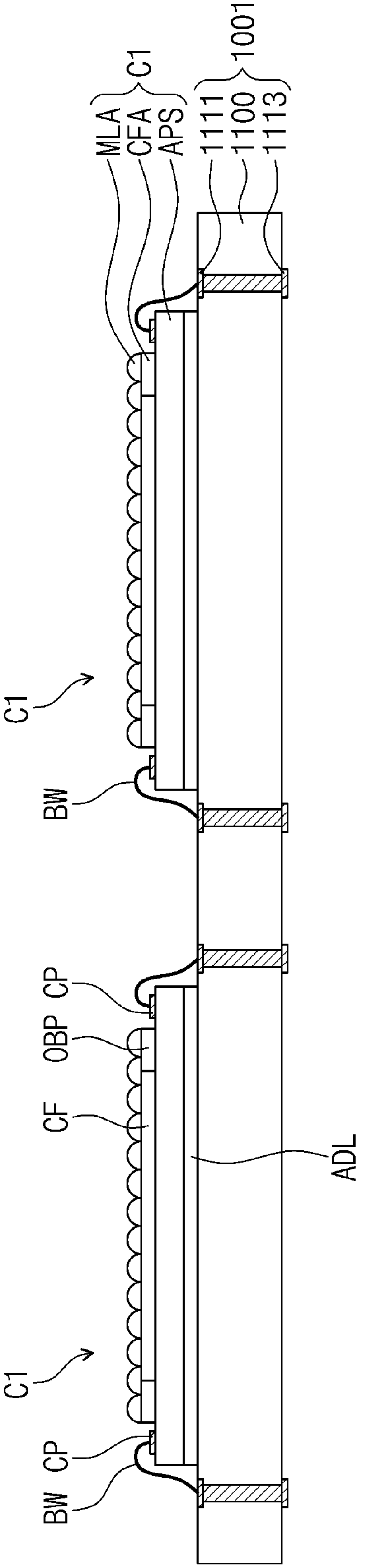

Referring to FIG. 19, a wire bonding process may be performed to connect the conductive pads CP of the image sensor chip C1 to corresponding bonding pads 1111 of the package substrate 1001 by bonding wires BW. The wire bonding process may be performed using, for example, a capillary. By the wire bonding process, a first end of the bonding wire BW may be connected to the conductive pad CP, and a second end of the bonding wire BW may be connected to the bonding pad 1111. For example, the bonding wire BW may include a metal such as gold (Au), but embodiments of the inventive concepts are not limited thereto.

Figure 20:
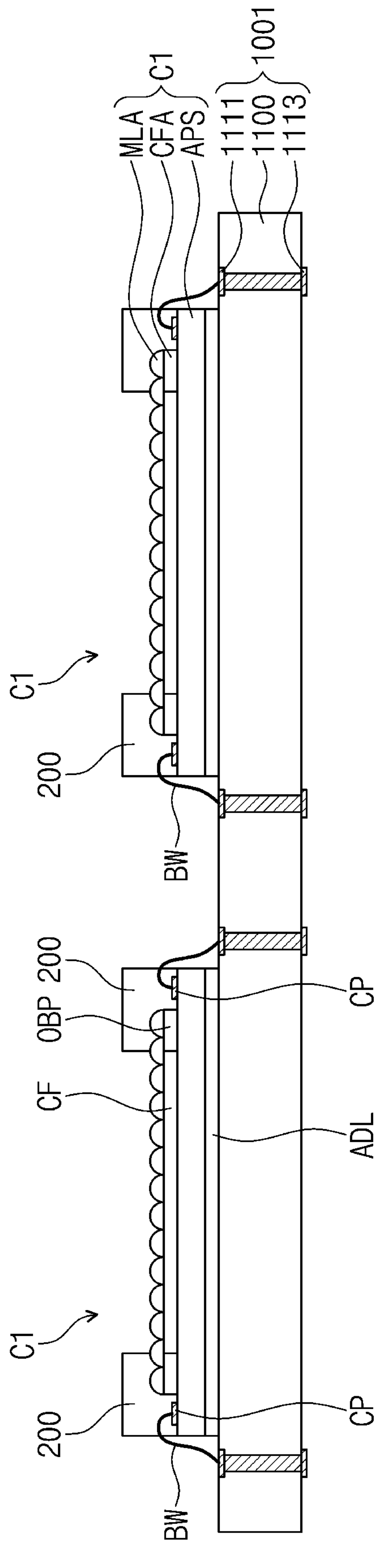

Referring to FIG. 20, a dam structure 200 may be formed on a top surface of the image sensor chip C1. The dam structure 200 may be formed by a dispensing method using a dispenser. In addition, the dam structure 200 may be formed by supplying an adhesive using a nozzle. The dam structure 200 may be formed of a glue adhesive, and the glue adhesive may include a filler.

The dam structure 200 may be provided on the pad region of the image sensor chip C1 and may have a tetragonal closed-curve shape (or polygonal continuous shape such as a square or rectangular shape) surrounding the pixel array region in a plan view.

The dam structure 200 may cover the conductive pad CP of the image sensor chip C1, and the first end of the bonding wire BW which is connected to the conductive pad CP. When the dam structure 200 is formed, the adhesive may be adhered onto a portion of the light blocking region of the image sensor chip C1.

According to the embodiments of the inventive concepts, at least two or more lens bar patterns may be provided in the light blocking region of the image sensor chip C1, and thus it is possible to prevent the organic material of the dam structure 200 from flowing onto the light receiving region by a capillary phenomenon between the first and second lens bar patterns LB1 and LB2 when the dam structure 200 is formed.

Figure 21:
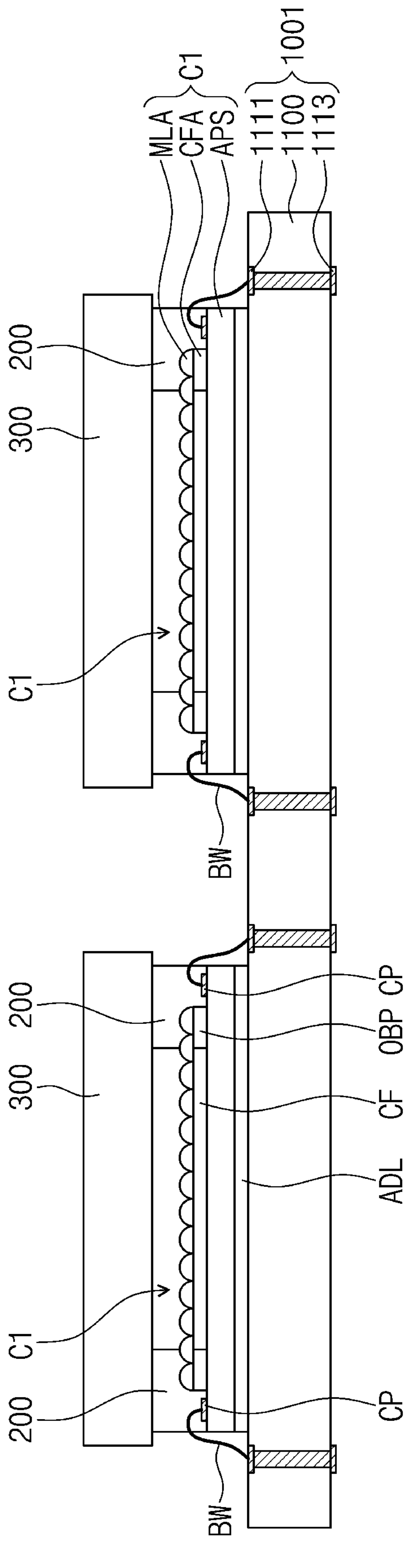

Referring to FIG. 21, a transparent substrate 300 may be adhered onto the dam structure 200. For example, the transparent substrate 300 may be located onto the dam structure 200, and heat and pressure may be applied thereto to fix the transparent substrate 300 on the dam structure 200. Since the transparent substrate 300 is so adhered, an empty space may be formed between the transparent substrate 300 and the image sensor chip C1.

Figure 22:
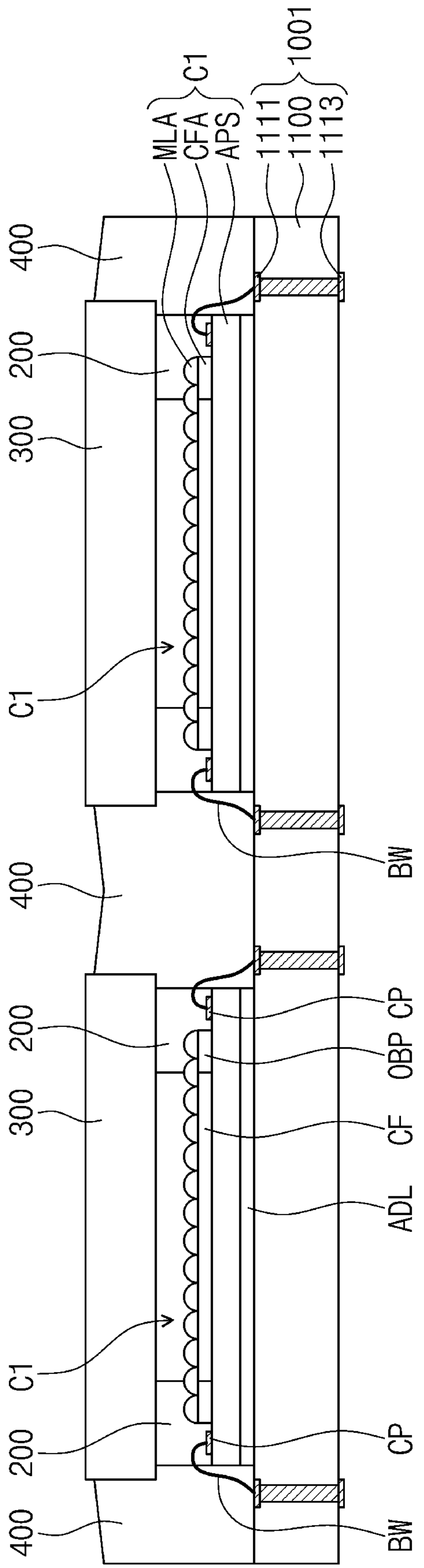

Referring to FIG. 22, a molding layer 400 may be formed on the package substrate 1001 to seal or cover the image sensor chip C1, the bonding wires BW, and the transparent substrate 300. The molding layer 400 may cover side surfaces of the image sensor chip C1 and the dam structure 200. In addition, the molding layer 400 may cover portions of a side surface and a bottom surface of the transparent substrate 300. The molding layer 400 may expose a top surface of the transparent substrate 300.

In addition, the molding layer 400 may cover the bonding pads 1111 of the package substrate 1001, and the second ends of the bonding wires BW which are adhered to the bonding pads 1111. The molding layer 400 may prevent the light receiving region of the image sensor chip C1 from being contaminated by an external foreign material and may protect the semiconductor package 1000 from an external impact.

After the formation of the molding layer 400, connection terminals such as solder balls may be adhered to the connection pads 1113 of the package substrate 1001.

Thereafter, a sawing process may be performed along a scribe line between the image sensor chips C1 to manufacture the semiconductor packages 1000 separated from each other. The molding layer 400 and the package substrate 1001 may be cut in the sawing process.

According to embodiments of the inventive concepts, the lens structure surrounding the light receiving region may be disposed in the light blocking region of the image sensor chip, and thus it is possible to prevent the organic material of the dam structure from flowing into the light receiving region when the dam structure is formed.

In addition, the lens structure and the dummy micro lenses may be formed in the light blocking region, and thus it is possible to prevent a crack phenomenon of the passivation layer caused by a difference in thermal expansion coefficient between the passivation layer and the upper planarization layer when the dam structure is formed on the light blocking region.

While embodiments of the inventive concepts have been particularly shown and described, it will be understood by one of ordinary skill in the art that variations in form and detail may be made therein without departing from the scope of the attached claims.

What is claimed is:

1. A semiconductor package comprising:

a package substrate;

an image sensor chip on the package substrate;

a transparent substrate on the image sensor chip; and a dam structure on an edge of the image sensor chip and between the image sensor chip and the transparent substrate, wherein the image sensor chip comprises:

a semiconductor substrate including a pixel array region and a pad region around the pixel array region, the pixel array region including a light receiving region and a light blocking region between the light receiving region and the pad region;

color filters on the light receiving region of the semiconductor substrate;

a light blocking pattern on the light blocking region of the semiconductor substrate;

micro lenses on the color filters; and a lens structure on the light blocking pattern and surrounding the light receiving region, wherein the dam structure is on at least a portion of the lens structure.

2. The semiconductor package of claim 1, wherein the lens structure comprises at least two lens bar patterns having continuous shapes surrounding the light receiving region.

3. The semiconductor package of claim 2, wherein the lens bar patterns are spaced apart from each other.

4. The semiconductor package of claim 2, wherein each of the lens bar patterns has a width substantially equal to a width of each of the micro lenses.

5. The semiconductor package of claim 1, wherein the lens structure comprises: a first lens bar pattern having continuous shape surrounding the light receiving region; and a second lens bar pattern including sub-lens bar patterns which are spaced apart from each other and are arranged around the light receiving region.

6. The semiconductor package of claim 5, wherein the sub-lens bar patterns are spaced apart from the first lens bar pattern by substantially equal distances.

7. The semiconductor package of claim 1, wherein the lens structure includes the same material as the micro lenses.

8. The semiconductor package of claim 1, wherein the dam structure is on the pad region and a portion of the light blocking region.

9. The semiconductor package of claim 1, wherein a thickness of the dam structure on the pad region is different from a thickness of the dam structure on the light blocking region.

10. The semiconductor package of claim 1, further comprising:

a passivation layer covering surfaces of the micro lenses and a surface of the lens structure, wherein a portion of the passivation layer is between the dam structure and the lens structure.

11. The semiconductor package of claim 1, further comprising:

an upper planarization layer between the lens structure and the light blocking pattern and between the micro lenses and the color filters; and conductive pads on the pad region of the semiconductor substrate, wherein the upper planarization layer does not cover top surfaces of the conductive pads, and wherein the dam structure covers the top surfaces of the conductive pads.

12. The semiconductor package of claim 1, further comprising:

dummy micro lenses spaced apart from the lens structure on the light blocking pattern, wherein the dummy micro lenses have substantially the same diameter as the micro lenses.

13. A semiconductor package comprising:

a package substrate comprising bonding pads;

an image sensor chip on the package substrate and comprising conductive pads connected to the bonding pads through bonding wires;

a transparent substrate on the image sensor chip; and a dam structure on an edge of the image sensor chip between the image sensor chip and the transparent substrate and covering the conductive pads, wherein the image sensor chip further comprises:

a semiconductor substrate including a pixel array region and a pad region around the pixel array region, the pixel array region including a light receiving region and a light blocking region between the light receiving region and the pad region;

photoelectric conversion elements in the pixel array region of the semiconductor substrate;

color filters on the light receiving region of the semiconductor substrate;

a light blocking pattern on the light blocking region of the semiconductor substrate;

micro lenses on the color filters;

at least two lens bar patterns on the light blocking pattern and surrounding the light receiving region;

an upper planarization layer between the light blocking pattern and the lens bar patterns and between the micro lenses and the color filters; and a passivation layer covering surfaces of the micro lenses and surfaces of the lens bar patterns, wherein the dam structure is on at least a portion of the at least two lens bar patterns.

14. The semiconductor package of claim 13, wherein at least one of the lens bar patterns has a continuous rectangular or square shape surrounding the light receiving region.

15. The semiconductor package of claim 13, wherein the lens bar patterns include the same material as the micro lenses.

16. The semiconductor package of claim 13, wherein at least one of the lens bar patterns comprises sub-lens bar patterns spaced apart from each other and arranged around the light receiving region.

17. The semiconductor package of claim 13, further comprising:

dummy micro lenses spaced apart from the lens bar patterns on the light blocking pattern, wherein the dummy micro lenses have substantially the same diameter as the micro lenses.

18. The semiconductor package of claim 17, wherein the dam structure is on the dummy micro lenses.

19. The semiconductor package of claim 17, wherein a thickness of the dam structure on the lens bar patterns is less than a thickness of the dam structure on the conductive pads.

20. An image sensor chip comprising:

a semiconductor substrate including a pixel array region and a pad region around the pixel array region, the pixel array region including a light receiving region and a light blocking region between the light receiving region and the pad region;

photoelectric conversion elements in the pixel array region of the semiconductor substrate;

color filters on the light receiving region of the semiconductor substrate;

a light blocking pattern on the light blocking region of the semiconductor substrate, micro lenses on the color filters; and a lens structure on the light blocking pattern and surrounding the light receiving region of the semiconductor substrate, wherein the lens structure comprises at least two lens bar patterns.

* * * * *